United States Patent
Nakahira et al.

(10) Patent No.: US 9,305,343 B2
(45) Date of Patent: Apr. 5, 2016

(54) OBSERVATION DEVICE AND OBSERVATION METHOD

(71) Applicant: Hitachi High-Technologies Corporation, Minato-ku, Tokyo (JP)

(72) Inventors: Kenji Nakahira, Tokyo (JP); Atsushi Miyamoto, Tokyo (JP); Takehiro Hirai, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 19 days.

(21) Appl. No.: 14/250,438

(22) Filed: Apr. 11, 2014

(65) Prior Publication Data

US 2014/0307946 A1  Oct. 16, 2014

(30) Foreign Application Priority Data

Apr. 12, 2013  (JP) .................. 2013-083478

(51) Int. Cl.
*G06K 9/00* (2006.01)
*G06T 7/00* (2006.01)
*G03F 7/20* (2006.01)

(52) U.S. Cl.
CPC ............ *G06T 7/0004* (2013.01); *G03F 7/7065* (2013.01); *G06K 9/00* (2013.01); *G06T 2207/10061* (2013.01); *G06T 2207/30148* (2013.01)

(58) Field of Classification Search
CPC ................. G06T 2207/30148; G06T 7/0048; G06T 7/0014; G06T 2207/10016; G06T 7/0081; H01J 2237/2817; H01J 2237/221; H01J 37/222; G06K 9/00771; G06K 9/00127; G06K 9/00288; G06K 9/00597; G06K 9/00369; G06K 9/46; G06K 9/00221; G06K 9/34; G06F 3/1208; G06F 17/30247; G06F 3/017; A61B 5/7264; G06Q 30/0601
USPC .......... 382/149, 190, 195, 243; 358/474, 453, 358/538

See application file for complete search history.

(56) References Cited

U.S. PATENT DOCUMENTS

| | | | |
|---|---|---|---|
| 5,978,100 A * | 11/1999 | Kinjo ............................. | 358/453 |
| 6,714,678 B2 * | 3/2004 | Lapstun ............... | B41J 2/17503 382/115 |
| 6,965,693 B1 * | 11/2005 | Kondo et al. ................ | 382/190 |
| 6,976,028 B2 * | 12/2005 | Fenton .............. | G06F 17/30038 707/914 |
| 7,095,871 B2 * | 8/2006 | Jones ................ | G06F 17/30876 382/100 |
| 7,561,723 B2 * | 7/2009 | Goldberg ............. | G03D 15/001 382/115 |
| 7,642,514 B2 | 1/2010 | Takane et al. | |
| 7,646,896 B2 * | 1/2010 | Yukhin .............. | G06K 9/00255 356/603 |
| 7,894,639 B2 * | 2/2011 | Grim, III .......... | G06F 17/30262 382/115 |

(Continued)

FOREIGN PATENT DOCUMENTS

| JP | 2006-190693 A | 7/2006 |
|---|---|---|
| JP | 2010-062106 A | 3/2010 |

(Continued)

*Primary Examiner* — Vu Le
*Assistant Examiner* — Aklilu Woldemariam
(74) *Attorney, Agent, or Firm* — Miles & Stockbridge P.C.

(57) ABSTRACT

A plurality of images is captured, and the plurality of images is integrated and displayed after one or more ROIs included in the captured images are extracted and classified. At integration, an integration method is controlled according to a classification result of the ROI.

14 Claims, 18 Drawing Sheets

(56) References Cited

U.S. PATENT DOCUMENTS

| | | | |
|---|---|---|---|
| 8,385,971 B2* | 2/2013 | Rhoads | G06F 17/30244 382/162 |
| 8,701,052 B1* | 4/2014 | Kuo et al. | 716/52 |
| 8,804,508 B1* | 8/2014 | Hobbs | H04N 21/2402 370/230 |
| 2002/0012467 A1* | 1/2002 | Shiratani | 382/224 |
| 2004/0183830 A1* | 9/2004 | Cody | G06Q 10/107 715/747 |
| 2005/0010635 A1* | 1/2005 | Schwesig | G11B 27/031 709/203 |
| 2006/0050928 A1* | 3/2006 | Ogawa | 382/103 |
| 2006/0088213 A1* | 4/2006 | Enomoto | 382/173 |
| 2006/0120560 A1* | 6/2006 | Davis | G06F 17/30247 382/100 |
| 2006/0253782 A1* | 11/2006 | Stark | G06F 17/30053 715/727 |
| 2007/0009152 A1* | 1/2007 | Kanda | 382/159 |
| 2008/0155588 A1* | 6/2008 | Roberts | G06Q 30/00 725/34 |
| 2008/0168117 A1* | 7/2008 | Coates | G06F 17/30867 709/201 |
| 2009/0013347 A1* | 1/2009 | Ahanger | G06Q 30/02 725/36 |
| 2009/0022403 A1* | 1/2009 | Takamori et al. | 382/195 |
| 2009/0158206 A1* | 6/2009 | Myllyla | G11B 27/105 715/804 |
| 2010/0074521 A1* | 3/2010 | Gomi et al. | 382/167 |
| 2010/0115037 A1* | 5/2010 | Hull | G06Q 30/02 709/206 |
| 2010/0119157 A1* | 5/2010 | Kameyama | 382/195 |
| 2010/0177363 A1* | 7/2010 | Zhou | 358/474 |
| 2010/0278425 A1* | 11/2010 | Takemoto et al. | 382/173 |
| 2011/0004922 A1* | 1/2011 | Bono | G06F 21/6263 726/4 |
| 2011/0013810 A1* | 1/2011 | Engstrom | G06K 9/00288 382/118 |
| 2011/0043540 A1* | 2/2011 | Fancher et al. | 345/672 |
| 2011/0187847 A1 | 8/2011 | Bai et al. | |
| 2011/0255747 A1* | 10/2011 | Iwasaki et al. | 382/103 |
| 2011/0288946 A1* | 11/2011 | Baiya | G06F 21/10 705/26.1 |
| 2011/0298915 A1* | 12/2011 | Hiroi et al. | 348/80 |
| 2012/0109779 A1* | 5/2012 | Shin | G06Q 30/0633 705/26.8 |
| 2012/0232999 A1* | 9/2012 | Roberts | G06Q 30/00 705/14.66 |
| 2013/0080523 A1* | 3/2013 | Rubinstein | H04L 51/32 709/204 |
| 2013/0121584 A1* | 5/2013 | Bourdev | G06K 9/00281 382/190 |
| 2013/0332855 A1* | 12/2013 | Roman | G06F 3/0481 715/753 |
| 2014/0032358 A1* | 1/2014 | Perkowitz | G06F 17/2785 705/26.7 |
| 2014/0040837 A1* | 2/2014 | Hsieh et al. | 716/52 |
| 2014/0043467 A1* | 2/2014 | Yamashita | 348/125 |
| 2014/0143666 A1* | 5/2014 | Kennedy | H04L 67/42 715/705 |

FOREIGN PATENT DOCUMENTS

| | | |
|---|---|---|
| JP | 2012-226842 A | 11/2012 |
| WO | WO 2010/106837 A1 | 9/2010 |

* cited by examiner

OBSERVATION DEVICE AND OBSERVATION METHOD

CROSS-REFERENCE TO RELATED APPLICATION

This application claims the priority of Japanese Patent Application No. 2013-083478, filed on Apr. 12, 2013, which is incorporated herein by reference in its entirety.

BACKGROUND OF THE INVENTION

1. Field of the Invention

The present invention relates to an observation device and an observation method.

2. Description of the Related Art

Charged particle microscopes have an extremely higher resolution than optical microscopes, and have been widely used to clearly observe a microscopic structure of an object to be observed. In a charged particle microscope, an enlarged image of the object sample is obtained by radiating an object sample with a charged particle beam, and detecting particles discharged from the object sample, or particles transmitting the object sample (charged particles of the same type or a different type from the irradiated charged particles, an electromagnetic wave, or photons) by a detector.

Especially, in a process of manufacturing a semiconductor, a charged particle microscope such as a scanning electron microscope, a scanning ion microscope, or a scanning transmission electron microscope is used for inspection of semiconductor wafers, measurement of a pattern size, measurement of a pattern shape, and the like. In these uses, observation of a semiconductor pattern or a defect, detection of the defect, and analysis of a cause of the defect, measurement of the pattern size, and the like are performed using a captured image.

In the charged particle microscope, it is important to provide an image that enables easy observation and analysis. Thus, it is necessary to display the image that allows a portion to be observed, analyzed, and the like (hereinafter, a region of interest (ROI)) to be easily viewed. As examples of an ROI include a region in which a defect on a semiconductor appears, a region in which a pattern to be observed appears, and the like. An image captured by the charged particle microscope may include a plurality of ROIs. To easily view an ROI, a plurality of images is often obtained where capturing conditions, an object to be captured, a position of a captured image, and the like are changed. Further, the detector has a plurality of types, such as a secondary charged particle detector, a backscattering particle detector, a detector that detects only specific particles or light, a detector that detects particles having energy or a spin direction within specific ranges, and the like. Information obtained by the individual detectors differs. Further, obtained information differs according to positions where the detectors are arranged, and thus many microscopes include a plurality of detectors of the same type or different types. If there is a plurality of microscopes, a plurality of captured images can be obtained by single image capturing.

To obtain an image having high visibility, a method of integrating a plurality of captured images has been proposed. For example, JP-2006-190693-A discloses "a charged particle beam device that includes a means to change a focus of a charged particle beam discharged from a charged particle source, a means to detect charged particles obtained in an irradiated portion of the charged particle beam of the sample, and a means to compose a secondary image of the sample as viewed from a charged particle beam source direction based on a signal of a portion where the charged particle beam is focused among signals output from the charged particle detector" (Abstract).

Further, JP-2010-62106-A discloses a method of "capturing a sample under different capturing conditions and obtaining a plurality of images of the sample, generating deterioration functions of the plurality of obtained images, respectively, generating an image in which the resolution has been improved using the plurality of obtained images and the generated deterioration functions corresponding to the images, and processing the image, in which the resolution has been improved" (Abstract).

Further, a method of integrating captured images in order to improve the visibility of an ROI has been proposed. Re-publication of PCT International Publication No. WO-2010/106837 discloses a pattern inspection device "that can make the specific gravity of the collation result image 74 higher in the known defect mode and the normal part, and can make the specific gravity of the detected image 71 higher otherwise, so as to generate a more natural review image 82" (Paragraph 0043), and a pattern inspection device "that can realize a composed image that further reflects the information of the detected image 71" by a morphing technique that is "a technology to compose the images such that the corresponding relationship between characteristic points of the images to be composed is maintained" (Paragraph 0044).

JP-2012-226842-A discloses a method of capturing an image of a sample using a charged particle microscope device, which directs "to capture an image having high image quality with respect to a region where a sufficient signal amount cannot be obtained from the sample, such as a lower layer region in a multilayer, or a bottom of a hole of a hole pattern", and the method of capturing an image includes: a first image acquisition step of setting a gain of a detector of the charged particle microscope device as a first gain value and scanning the sample with a charged particle beam, and acquiring a first image; a second image acquisition step of setting a gain of the detector to a second gain value different from the first gain value and scanning the sample with the charged particle beam, and acquiring a second image; and an image composing step of composing the first image and the second image.

SUMMARY OF THE INVENTION

However, when the appearance of an object ROI is significantly different depending on each ROI, it is a problem that an appropriate integration method is different. In the electron beam pattern inspection device disclosed in Re-publication of PCT International Publication No. WO-2010/106837, the device only deals with defects as the ROI, and the electron beam pattern inspection device captures a low magnification image and detects a defect, and thus the shapes of the ROIs do not significantly differ. JP-2012-226842-A only handles dark parts as the ROI.

Meanwhile, for example, in a charged particle microscope that captures a defect at a high magnification (e.g., at a magnification of 100,000 times), and performs length measurement and observation, such as a length measurement SEM or a defect review SEM, the appearance of an object ROI may significantly differ for each ROI. An image that can be easily viewed can be sometimes created using only image deformation by conventional weighted addition processing or morphing technique, the appearance of ROI may be sometimes viewed unnatural and less easily viewed depending on the ROI. As described above, when various ROIs having different appearances are used, an integration method that is different from conventional methods is required.

The present invention provides a means to generate and display an image that is excellent in appearance even in the cases above.

The present invention solves the above-described problems by a method of displaying an image and an observation device in which the method of displaying an image is incorporated, described below.

According to the present invention, an observation device and an observation method that provide an image that enables an ROI to be easily viewed can be provide.

BRIEF DESCRIPTION OF THE DRAWINGS

FIG. 15 is a diagram of an embodiment illustrating processing of identifying which one of an upper layer pattern region, a lower layer region, and a pattern side wall region an ROI belongs to;

DESCRIPTION OF THE PREFERRED EMBODIMENTS

The present invention relates to a scanning charged particle microscope that radiates a sample with charged particles and obtains an image, and especially provides a method of displaying an image having high visibility and a device thereof. Hereinafter, embodiments according to the present invention will be described with reference to the drawings.

Figure 1:
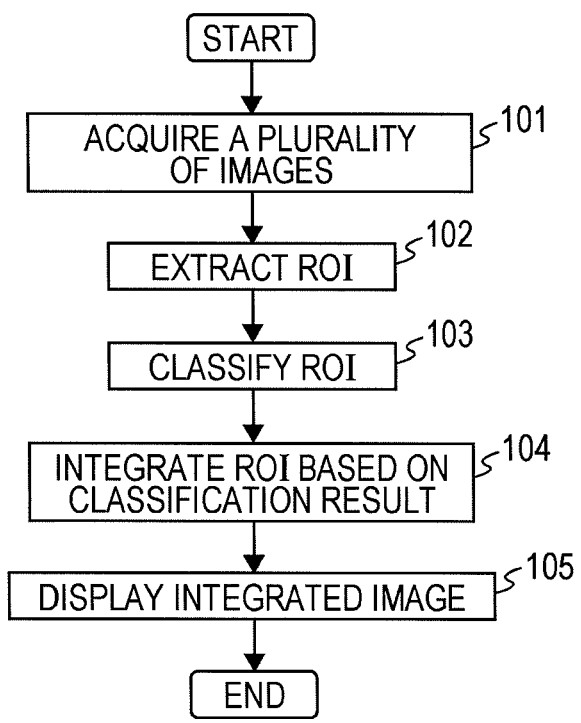
FIG. 1 is a diagram of an embodiment illustrating a sequence of extracting and classifying ROIs, and integrating a plurality of captured images based on a classification result.

FIG. 1 is a diagram of an embodiment illustrating a sequence of extracting and classifying ROIs, and integrating a plurality of captured images based on a classification result. First, in step 101, a plurality of captured images is acquired. Next, in step 102, ROIs are extracted from the captured images, and in step 103, the ROIs are classified. Next, in step 104, the plurality of captured images is integrated based on a classification result of the ROIs. That is, a single image (integrated image) is generated, in which a brightness value is obtained for each pixel, using information about the same pixel or about pixels in a neighboring region of the same pixel in the plurality of captured images. Finally, in step 105, the integrated image is displayed.

The appearance of the object ROI often substantially differs for each ROI. To deal with that, the ROIs included in the captured images are classified, and the integration method is controlled according to a result of the classification, so that the integration can be performed by a method suitable for each ROI, and thus an image that enables the ROI to be always easily viewed can be provided.

Figure 2:
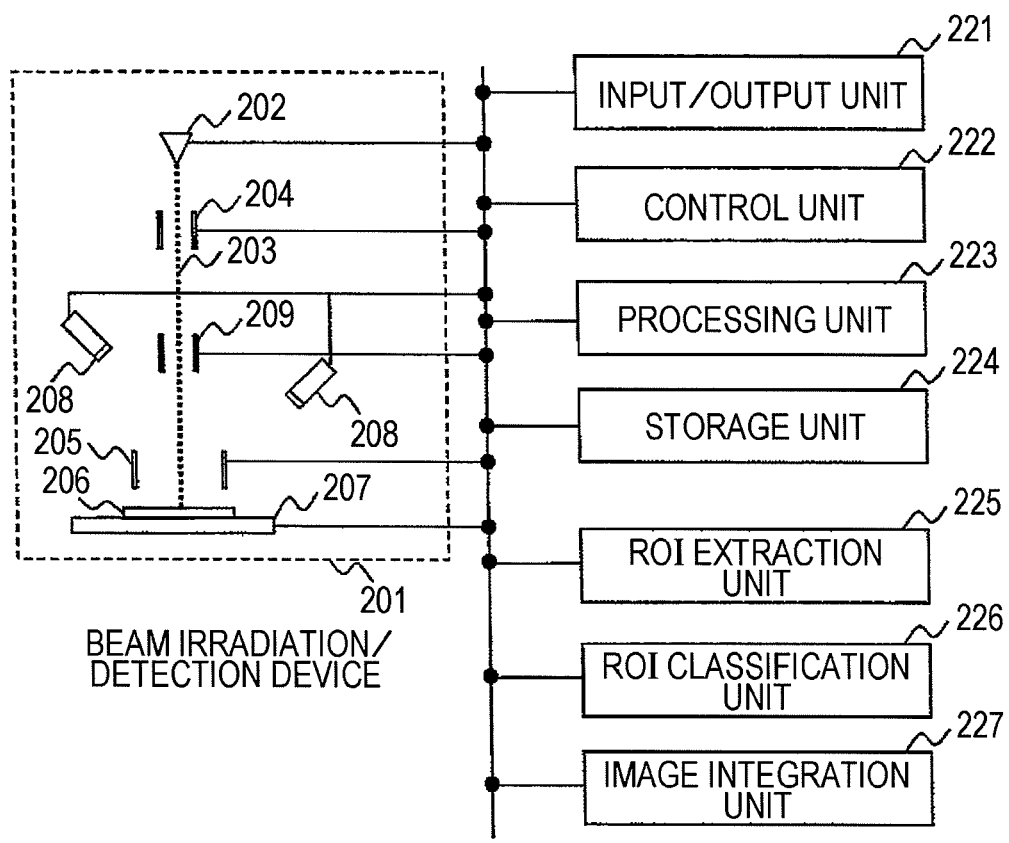
FIG. 2 is a basic configuration of a charged particle microscope that is an embodiment of the present invention.

FIG. 2 is a basic configuration of a charged particle microscope that is an embodiment of the present invention. The charged particle microscope is configured from, for example, a charged particle image acquisition device 201, an input/output unit 221, a control unit 222, a processing unit 223, a storage unit 224, an ROI extraction unit 225, an ROI classification unit 226, an image integration unit 227, and the like. The charged particle image acquisition device 201 generates a charged particle beam 203 from a charged particle gun 202, allows the charged particle beam 203 to pass through a condenser lens 204 and an object lens 205 to be focused on a surface of a sample 206. Next, an image is acquired by detecting particles generated from the sample 206 by a detector 208. The image is stored in the storage unit 224. A plurality of detectors 208 may be provided. Further, detectors that detect different particles, like a detector that detects an electron and a detector that detects an electromagnetic wave may be employed. Further a detector that detects only particles, energy or a spin direction of which falls within a specific range, or detectors that detect particles having different characteristics, like a secondary charged particle detector and a backscattering particle detector may be employed. Alternatively, detectors that detect particles having the same characteristic may be provided in different locations. When a plurality of detectors is provided, usually, a plurality of images can be acquired by single capturing. The capturing conditions are changed and capturing may be performed twice or more, and a plurality of images can be acquired. The sample 206 is in contact with a stage 207. By moving the stage 207, an image of the sample in an arbitrary position can be acquired. Further, the charged particle beam can be scanned on the sample by changing the direction of the charged particle beam 203 by a beam deflector 209 in a two dimensional manner.

The input/output unit 221 performs an input of an image capturing position and a capturing condition, an output of an integrated image, and the like. The control unit 222 controls a voltage to be applied to the charged particle gun 202, adjustment of focal positions of the condenser lens 204 and the object lens 205, movement of the stage 207, and the like, as control of an image capturing device. Further, the control unit 222 controls the input/output unit 221, the processing unit 223, the storage unit 224, the ROI extraction unit 225, and the ROI classification unit 226. The processing unit 223 performs various types of processing such as processing related to automatic focusing necessary for adjusting a focal point of the charged particle beam 203 on a surface of the sample 206. The storage unit 224 stores a plurality of captured images, the integrated image, an ROI extraction result, an ROI classification result, various processing parameters, and the like. The ROI extraction unit 225 extracts ROIs from the plurality of obtained captured images. The ROI classification unit 226 classifies the extracted ROIs. The image integration unit 227 integrates the plurality of captured images to generate a single integrated image. At this time, the image integration unit 227 controls the integration method based on the classification result of the ROIs.

Figure 3:
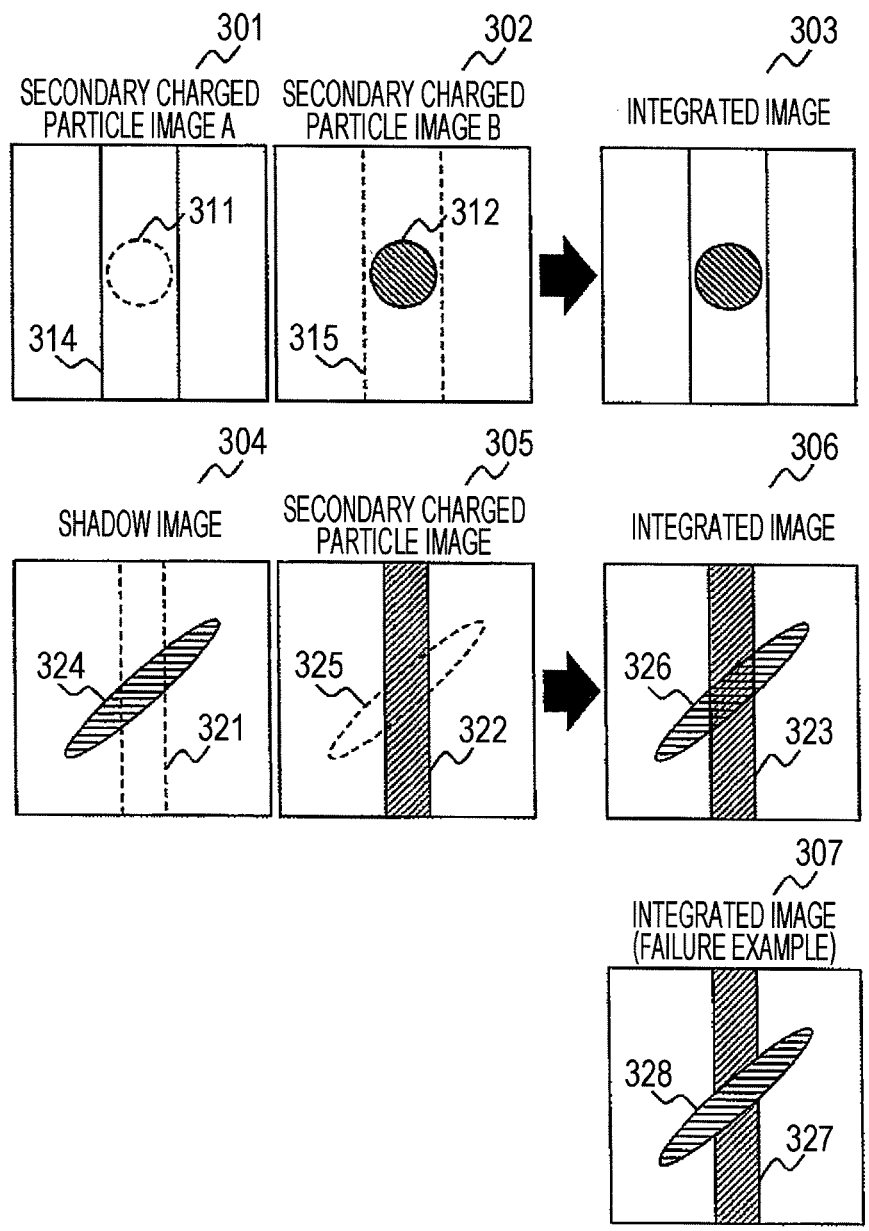
FIG. 3 is a diagram of an embodiment illustrating advantages and problems of integrating a plurality of captured images.

FIG. 3 is a diagram of an embodiment illustrating advantages and problems of integration of a plurality of captured images. An integrated image 303 is an example of an image obtained by integrating two images (secondary charged particle images) 301 and 302 obtained by a secondary charged particle detector. The images 301 and 302 are obtained by capturing the same position on a sample. These captured images may be images obtained by single scanning using a plurality of detectors arranged on different positions, or may be images captured by changing the capturing conditions. A defect 311 and a pattern 314 appear in the image 301, and the defect 311 has a low contrast (in FIG. 3, the region surrounded by the dotted line indicates a low contrast). A defect 312, which is the same as the defect 311, appears in the image 302, but the contrast of the defect 312 is higher than that of the image 301. Meanwhile, a pattern 315, which is the same as the pattern 314, appears in the image 302, but the contrast of the pattern 315 is lower than that of the pattern 314. It is desired to generate an image that includes a high-contrast defect and a high-contrast pattern by integrating these captured images. To realize it, a method of applying weighted addition to the images 301 and 302 is suitable. To be specific, the weighted addition may just be performed such that the defect region 312 is extracted from the image 302, and a weight given to the image 302 in relation to the defect region is made large, while a weight given to the image 301 in relation to other regions is made large.

An integrated image 306 is an example of an image obtained by integrating an image 304 with a shadow (shadow image) and a secondary charged particle image 305, which are obtained by a backscattering particle detector. The images 304 and 305 are obtained by capturing the same position on the sample. A pattern 322 and a scratch defect (a scratch caused in the surface of the sample) 325 appear in the secondary charged particle image 305, and the scratch defect 325 has a low contrast and poor visibility. To deal with that, it is desired to generate an integrated image in which the scratch defect clearly appears. Since the scratch defect can be clearly viewed in the shadow image 304, information thereof may just be integrated. However, an appropriate image cannot be generated by a method similar to the method of when the integrated image 303 is generated, that is, by the integration by means of weighted addition where the scratch defect region 324 is extracted, and a weight to the image 304 in the region is made large while a weight to the image 305 in other regions is made large. An example of an integrated image obtained by such weighted addition is illustrated by an image 307. While both of a pattern 327 and a scratch defect 328 are clearly viewed, the pattern 327 does not appear in the scratch defect region, and thus the image is unnatural. To generate an image having the pattern appearing in the scratch defect region, like the integrated image 306, it is necessary to use an integration method that is not the simple weighted addition. In view of the foregoing, it is desired to perform the integration by weighted addition in the case of the captured images 301 and 302, while to perform integration other than weighted addition in the case of the captured images 304 and 305. In the present invention, a favorable integrated image is generated by selecting a suitable integration method according to the type of the ROI (in this example, the defect region).

Next, integration processing corresponding to step 104 of FIG. 1 will be described with reference to FIGS. 4 to 10. It will be shown that an image having favorable image quality can be obtained if the integration processing can be controlled based on a classification result of ROIs by showing suitable integration processing differs for each type of ROI using specific examples. A method of classifying ROIs will be described with reference to FIGS. 13 to 15 below, and a method of controlling the integration processing will be described with reference to FIGS. 16 to 18 below. Assume that, in FIGS. 4 to 10, the processing of steps 101 to 103, that is, the processing of acquiring a plurality of images, and extracting and classifying ROIs have already been applied in advance.

Figure 4:
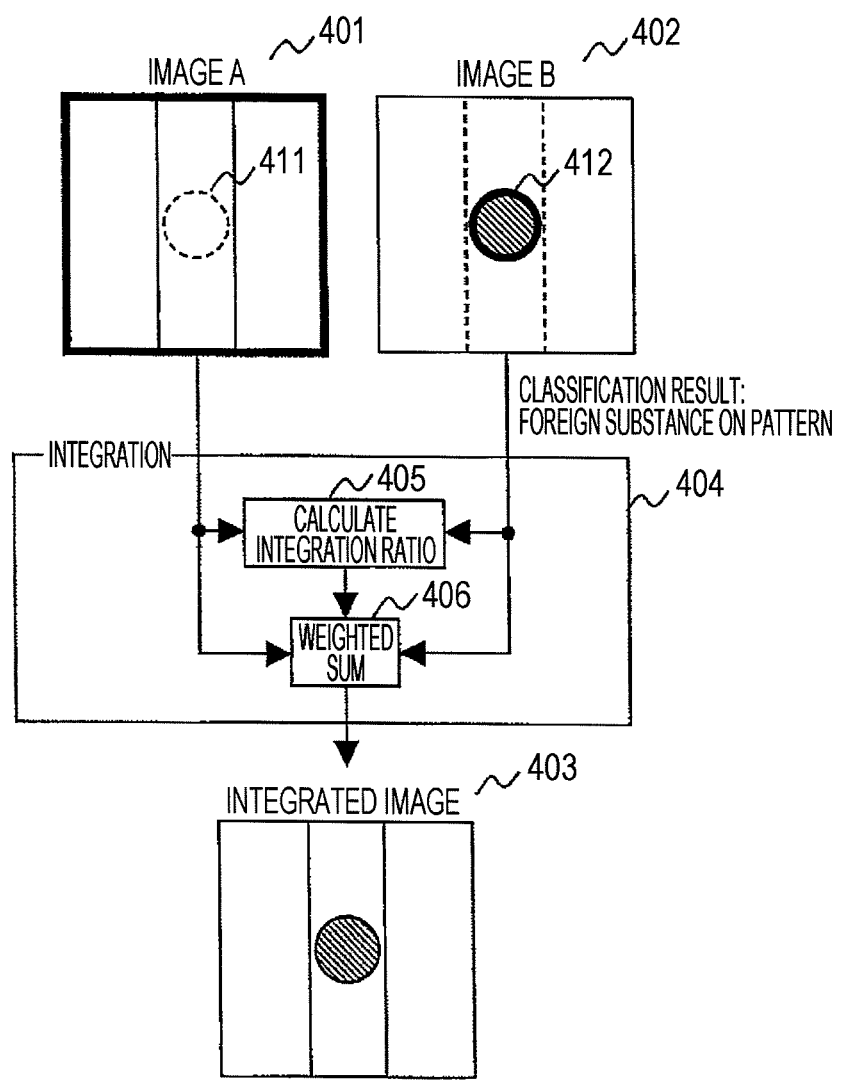
FIG. 4 is a diagram of an embodiment illustrating an example of integrating two captured images by weighted addition.

FIG. 4 is a diagram of an embodiment illustrating an example of integrating two captured images by weighted addition. Images 401 and 402 are the same as the images 301 and 302 in FIG. 3. At the integration, an image to be mainly used in regions other than an ROI (hereinafter, called base image) is determined. In this example, the image 401 is the base image. Further, in this example, a region in which a defect 412 appears is the ROI. Hereinafter, the base image is surrounded by a thick frame, and similarly, the ROI is also surrounded by a thick frame. As a classification result of ROI, a foreign substance on the pattern is obtained. The ROI in the image 401 has a low contrast, while the ROI in the image 402 has a high contrast. Thus, in integration processing 404, first, weights are set such that a weight to the image 402 in the ROI is made large, and a weight to the image 401 in regions other than the ROI is made large in integration ratio calculation processing 405, and the weighted addition is performed in weighted sum processing 406. Accordingly, an integrated image 403 is obtained.

Note that any number of integrated images may be output. For example, an integrated image generated based on the image 401 and an integrated image generated based on the image 402 may be output. Further, three or more captured images may be used. While an example of performing the weighted addition in the weighted sum processing 406 has been described, the method is not limited to the weighted addition. For example, a method of calculating weighted addition after applying a certain function f (e.g., a logarithmic function) to the brightness values of two images, and finally applying an inverse function of f may be employed. The integrated image is not necessarily a gray scale image, and may be a color image. For example, the ROI may be colored and displayed to be easily viewed, and regions other than the ROI may be displayed as a gray scale image. In this case, weights are calculated with respect to respective components (e.g., red, green, and blue) that express the color image in the integration ratio calculation processing 405, and the weighted addition processing may just be performed for each component in the weighted sum processing 406.

Figure 5:
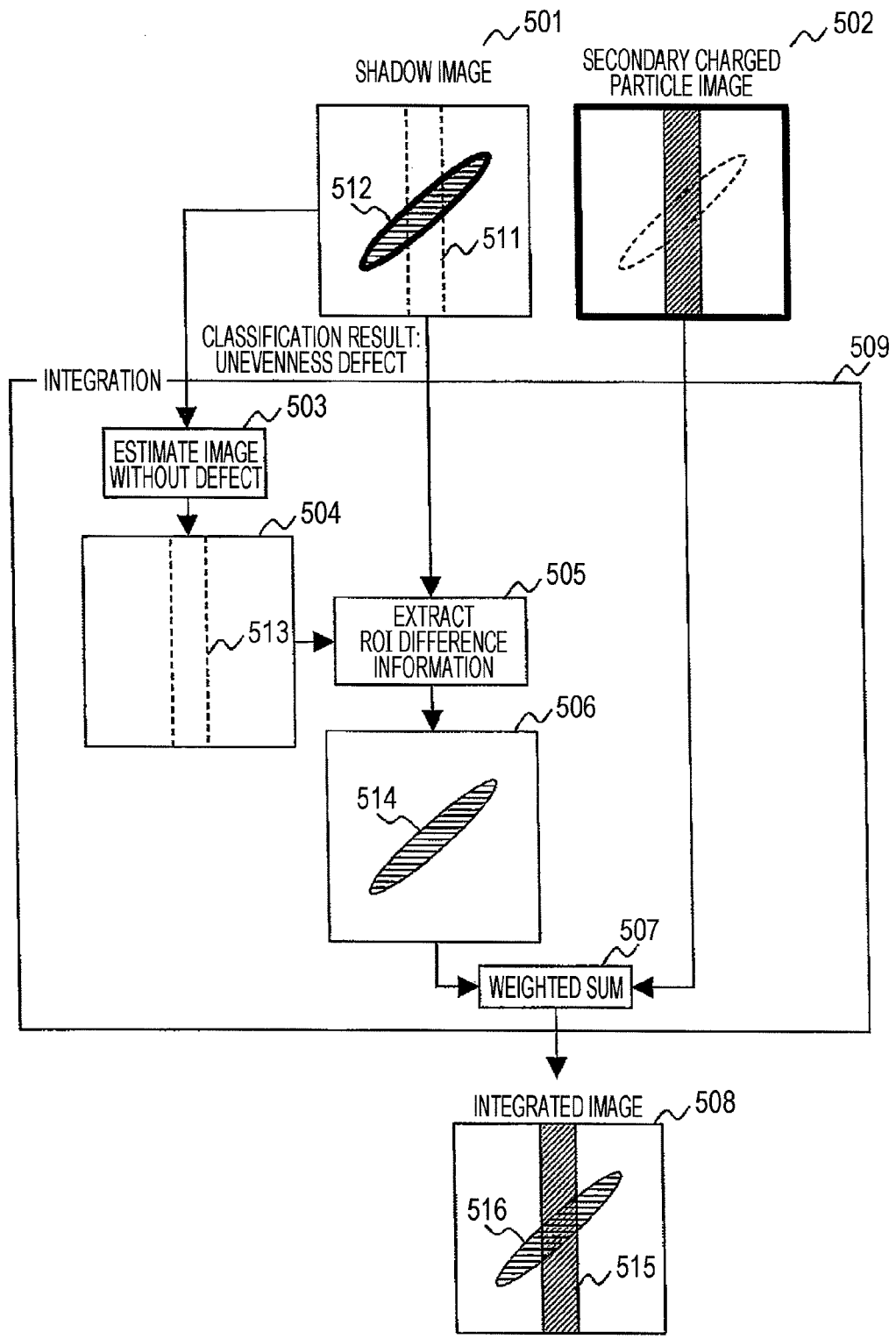
FIG. 5 is a diagram of an embodiment illustrating an example of integrating two captured images by a method other than the weighted addition.

FIG. 5 is a diagram of an embodiment illustrating an example of integrating two captured images by a method other than the weighted addition. Images 501 and 502 are the same as the images 304 and 305 in FIG. 3. The base image is the image 502. That is, a scratch defect 512 of a shadow image 501 is integrated to the secondary charged particle image 502. As a classification result of ROI, an uneven defect is obtained, for example. In the integration processing, first, information related to a pattern 511 and the like are removed from the shadow image 501, and only unevenness information indicating the scratch defect 512 is extracted. To perform the extraction, first, processing 503 of estimating an image without the defect is performed, and information of a pattern 513 like an image 504 is extracted. In this processing, the pattern information may be extracted using the secondary charged particle image 402, for example, or the extraction may be performed using comparison with an image obtained by capturing another place that does not include a defect or design data. The estimation may be performed using a technology such as in-painting after deleting a pixel in the ROI. Next, in processing 505 of extracting ROI difference information, a difference between the shadow image 501 and the image 504 is calculated, so that an image 506 that reflecting only the unevenness information indicating the scratch defect like an image 514 is obtained. Following that, in weighted sum processing 507, an integrated image 508 is generated by performing weighted addition of the secondary charged particle image 502 and the image 506. In the image 508, only unevenness information 516 of the ROI is superimposed on a pattern 515, and natural integration is obtained. To properly use the integration method by the weighted addition illustrated in the example of FIG. 4 and the integration method illustrated in the example of FIG. 5, classification to determine whether a defect is an opaque defect like the defect 412 or a defect is a transparent defect through which a pattern that underlays the defect appears like the defect 512 may be performed. Note that the weighted sum processing 507 corresponds to processing in which the integration ratio calculation processing 405 and the weighted sum processing 406 in FIG. 4 are put together. Hereinafter, for ease of description, the weighted sum processing includes the integration ratio calculation processing.

The images 501 and 502 of FIG. 5 may be images obtained by detecting particles having high energy and particles having low energy. If the energy of the detected particles is different, information included in the particles differs, and thus the images may be significantly changed. Alternatively, images obtained by detecting different types of particles may be used.

Figure 6:
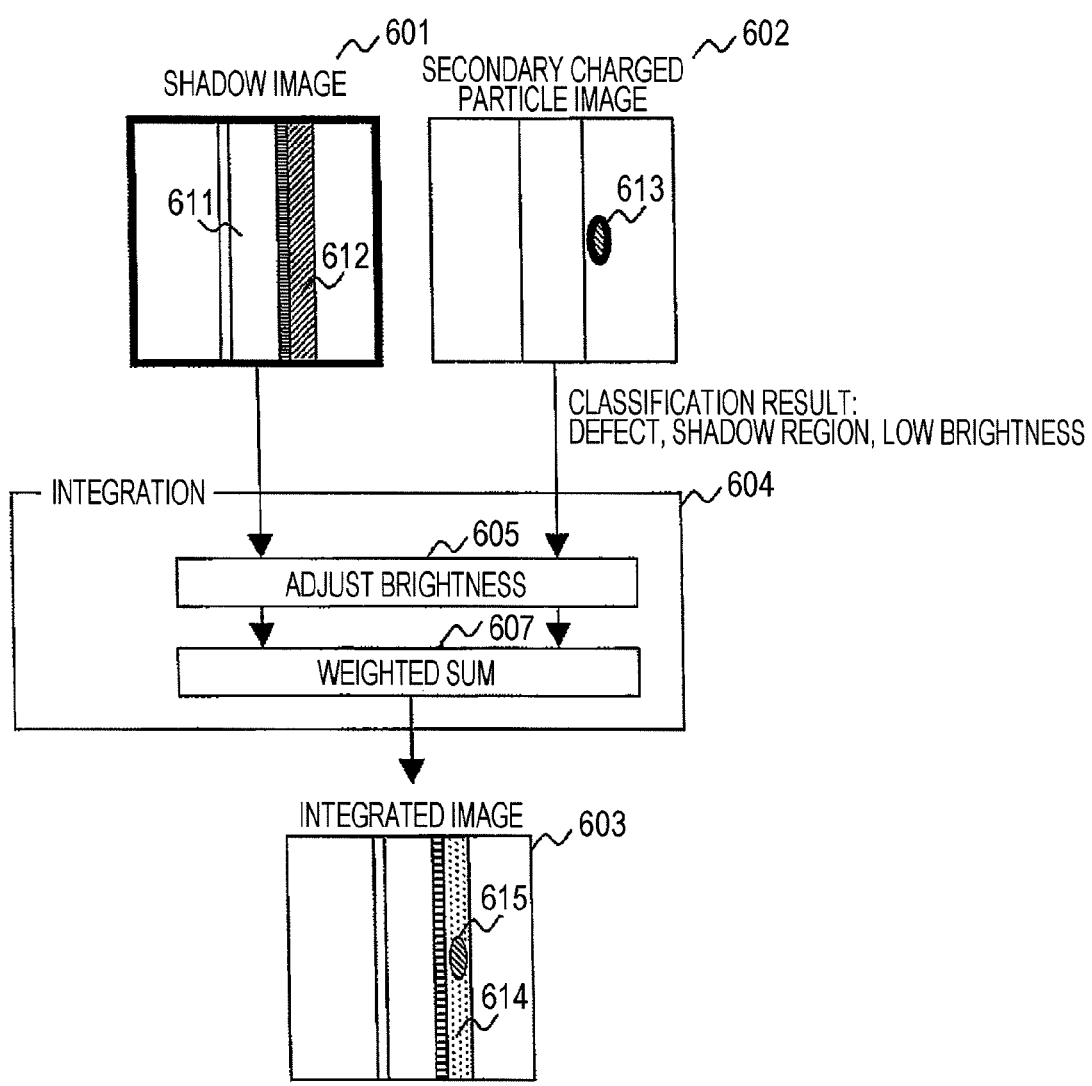
FIG. 6 is a diagram of an embodiment illustrating an example of integrating two captured images, which is different from the examples of FIGS. 4 and 5.

FIG. 6 is a diagram of an embodiment illustrating an example of integrating two captured images, which is different from the examples of FIGS. 4 and 5. An image 603 is obtained by integrating two images of a shadow image 601 and a secondary charged particle image 602. As a classification result of ROI, a defect having low brightness in a shadow region is obtained. A pattern 611 appears in the image 601. A region 612 corresponds to a portion of a shadow of the pattern, and has a lower brightness value than a similar region that is not a shadow. Meanwhile, a defect 613 that is the ROI appears in a position in the region of the shadow of the image 601, and the brightness value of the defect is lower than its peripheral region. No shadow of the pattern is seen on the image 602. It is desired to integrate the two images. However, when a brightness/darkness relationship is inverted, typically, an unnatural image is obtained. Therefore, to perform integration where the brightness/darkness relationship is maintained, first, brightness adjustment processing 605 is performed with respect to each of the images 601 and 602, and then, weighted sum processing 607 is performed. In the brightness adjustment processing 605, the brightness of each image is adjusted based on both pieces of information of the images 601 and 602. By adjusting the brightness before the weighted sum, the entire brightness balance is adjusted such that the brightness value of the defect 615 can be further lowered while a shadow portion 614 having a lower brightness value than the peripheral region is maintained, in the image 603. Typically, it is not possible to keep the brightness/darkness relationship while maintaining a high contrast in the integration only by the simple weighted addition. However, combination of the weighted addition and the brightness adjustment processing makes it possible.

Figure 20:
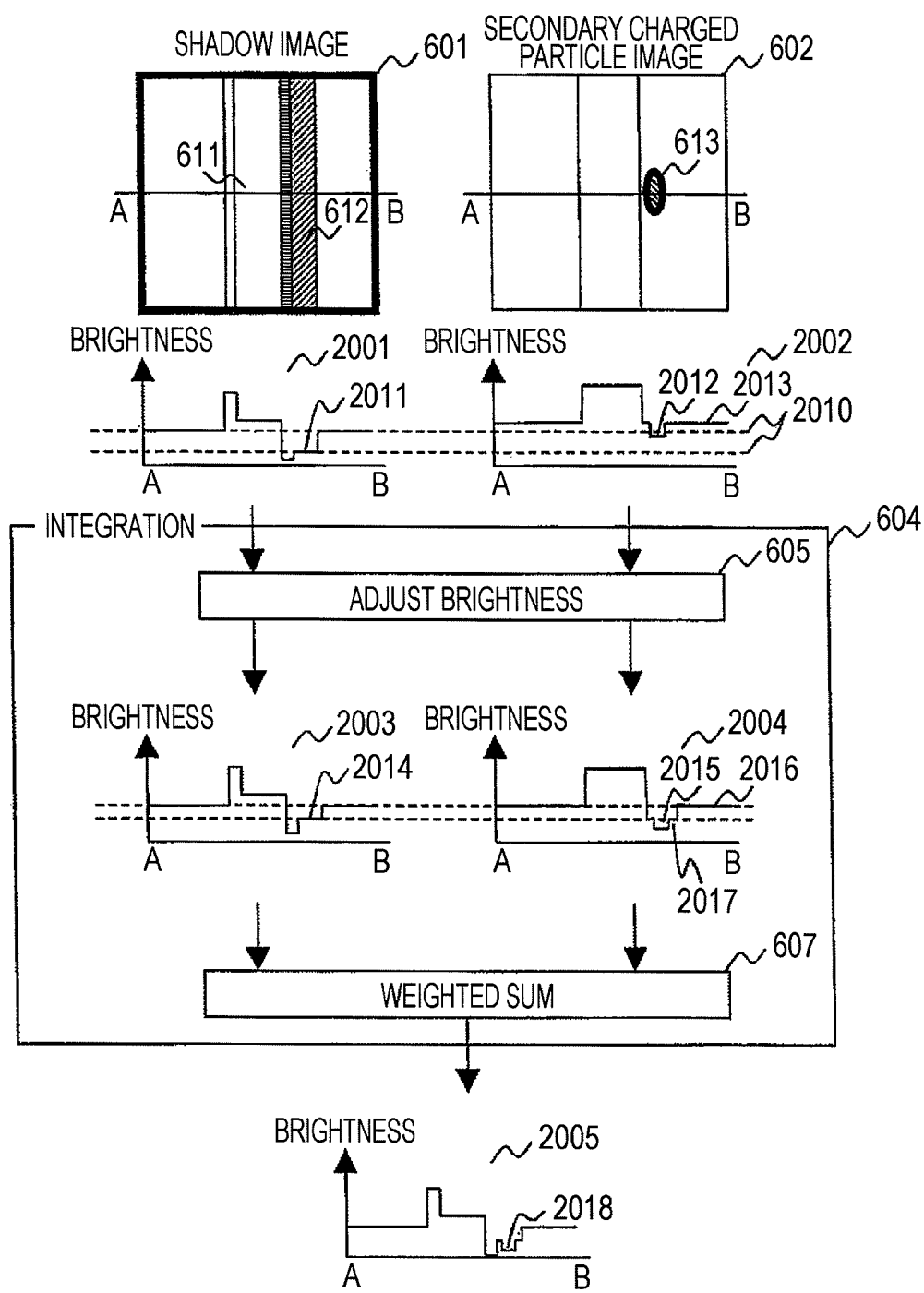
FIG. 20 is a diagram of an embodiment illustrating details of brightness adjustment processing in FIG. 6.

FIG. 20 is a diagram of an embodiment illustrating details of the brightness adjustment processing 605 in FIG. 6. The same images and processing as FIG. 6 are illustrated by the same numbers as FIG. 6. Hereinafter, when referring to the same image or processing, the same number is denoted and indicated. Graphs 2001 and 2002 illustrate the brightness values of images 601 and 602 in a line segment AB. Broken lines 2010 are auxiliary lines for description. The brightness value of a shadow region 2011 is lower than that of a region to the right thereof. Further, the brightness value of an ROI 2012 of a secondary charged particle image is lower than that of a region to the right thereof. The brightness value of a region 2013 of a secondary charged particle image is higher than that of the same region of the shadow image. Graphs 2003 and 2004 illustrate the brightness values in the line segment AB after the brightness adjustment processing 605 is performed.

According to a classification result of ROI performed in advance, it is found that the ROI is a defect existing in the shadow region and having a low brightness. However, the brightness value of the shadow region of the shadow image is low, and thus even if the ROI of the secondary charged particle image is integrated on the image 601 as it is, a sufficient contrast cannot be obtained. Therefore, first, in the brightness adjustment processing 605, adjustment is performed so that the brightness value of a shadow region 2014 of the shadow image becomes high. Next, the brightness value of a region 2017 that is a peripheral region of the ROI of the secondary charged particle image is adjusted to the brightness value of the same region of the shadow image (that is, the shadow region 2014). Further, the brightness value of an ROI 2015 is made low so that the brightness values of the ROI 2015 and its peripheral region are maintained constant. Further, the brightness values of a region 2016 and the like may be adjusted to that of the same region of the shadow image in order to prevent an unnatural result in the weighted sum processing 607. A graph 2005 illustrates the brightness value of an integrated image in the line segment AB. As illustrated in the graph 2005, an integrated image, in which the brightness value of an ROI 2018 is lower than that of a peripheral region while the contrasts of the ROI and the peripheral region are maintained, can be obtained by performing the brightness adjustment processing 605.

The brightness values of regions of images may significantly differ among a plurality of captured images. For example, when different types of detectors are used, types and characteristics of particles detected by the respective detectors are different, and thus, typically, the brightness values significantly differ. Further, the brightness values differ because the numbers of particles that reach respective detectors are changed depending on the positions where the detectors are arranged. When such a plurality of captured images is integrated, an integrated image obtained by the weighted addition may be unnaturally viewed because the brightness and darkness are inverted. In contrast, in the present invention, the integration is performed while the brightness/darkness relationship of the ROI and the peripheral region of the ROI are maintained by performing the brightness adjustment. Accordingly, the present invention enables the integration after suppressing the inverse of the brightness and darkness.

Figure 7:
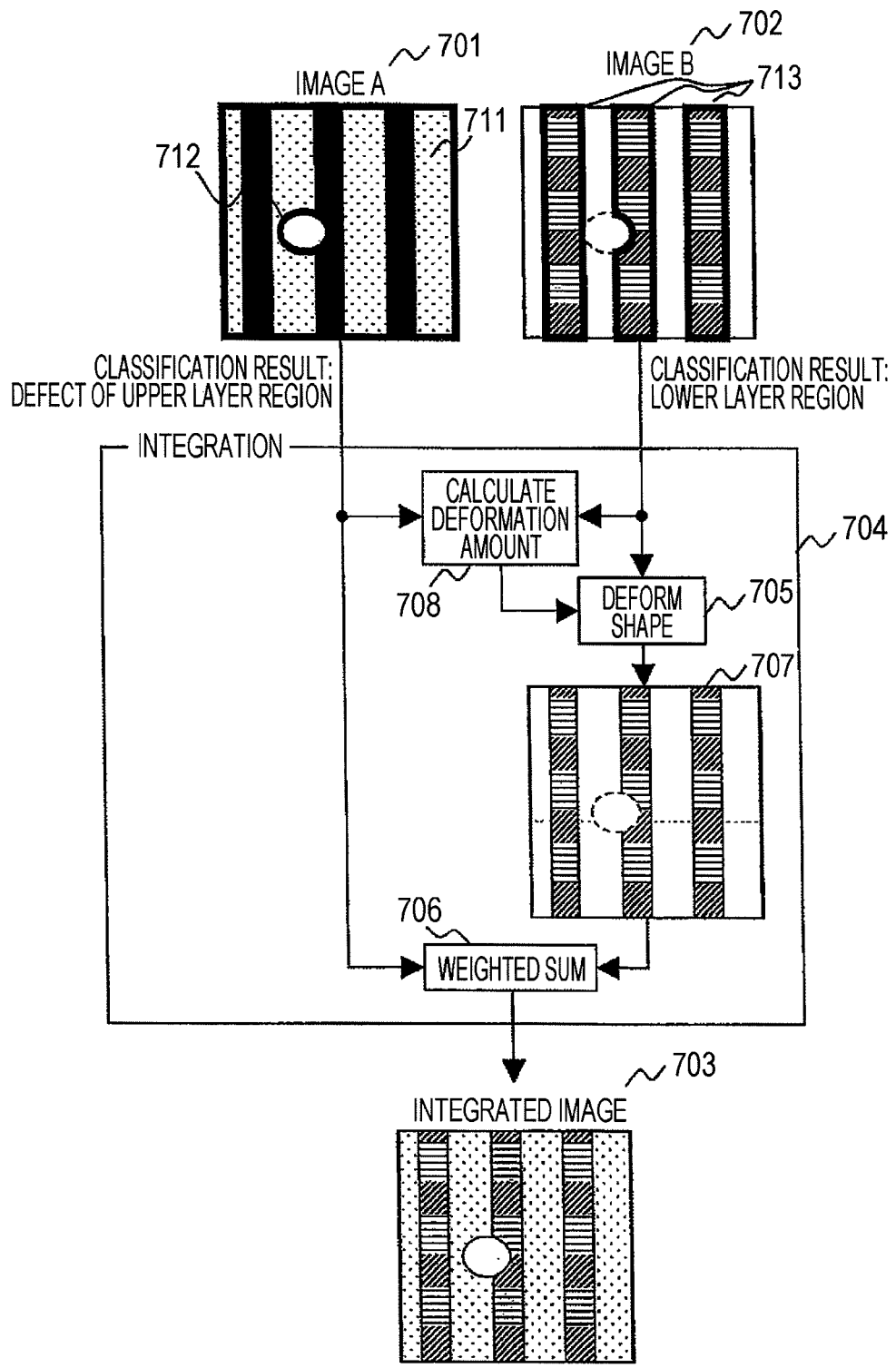
FIG. 7 is a diagram of an embodiment illustrating processing of integrating two captured images that appear in different shapes.

FIG. 7 is a diagram of an embodiment illustrating processing of integrating two captured images that appear in different shapes. An image 703 is obtained by integrating two images 701 and 702 by processing 704. An object to be captured is a multilayer pattern including a foreign substance. As a classification result of ROI, an ROI 712 that is a defect in an upper layer region and an ROI 713 that is in a lower layer region are obtained. An upper layer pattern 711 and the defect 712 appear clearly in the image 701, but a sufficient contrast cannot be obtained in the lower layer. Meanwhile, the lower layer region 713 appears clearly, but the visibility of the upper layer pattern and the defect is poor in the image 702. In a shadow image, the contrast tends to be low in the lower layer region because a sufficient number of charged particles cannot be detected, compared with the secondary charged particle image, and thus, in the lower layer region, the visibility of the secondary charged particle image is often higher than that of the shadow image. It is desired to integrate a region of the lower layer region of the image 702 with the image 701. However, between the images 701 and 702, the widths of the lower layer regions are different, and the width of the image 701 is narrower than that of the image 702. Therefore, first, deformation amount calculation processing 708 is performed using the images 701 and 702. The deformation value is calculated for each pixel or region. Next, shape deformation processing 705 is performed with respect to the image 702, and an image 707 in which the width of the lower layer region is adjusted to that of the image 701 is generated. Following that, an integrated image 703 is generated by weighted sum processing 706 of the images 701 and 707. In the deformation amount calculation processing 708 and the shape deformation processing 705, the processing is performed such that not only a joint of a boundary between the upper layer pattern and the lower layer region, but also a joint of a boundary between the lower layer region and the defect 712 is viewed natural. Note that, in the present embodiment, the shape deformation is performed with respect to the image 702, and the width of the lower layer region of the image 702 is adjusted to the image 701. However, the shape deformation may be performed with respect to the image 701, and the width of the lower layer region of the image 701 may be adjusted to the image 702.

Like the example of the images 701 and 702, among the plurality of captured images, things appearing in the images may differ for each pixel due to image distortion. At a boundary portion of the pattern, information of the upper layer pattern is dominant in the image 701, while information of the lower layer region is dominant in the image 702. Thus, the widths of the lower layer regions are viewed differently. Therefore, if the shape is not appropriately deformed, a failure of a discontinuous boundary and the like is caused when the images are integrated. Therefore, in some cases, not only the ROI but also the peripheral region thereof may need to be deformed. In contrast, the present invention can naturally perform the integration even in a case of a captured image having image distortion.

Figure 8:
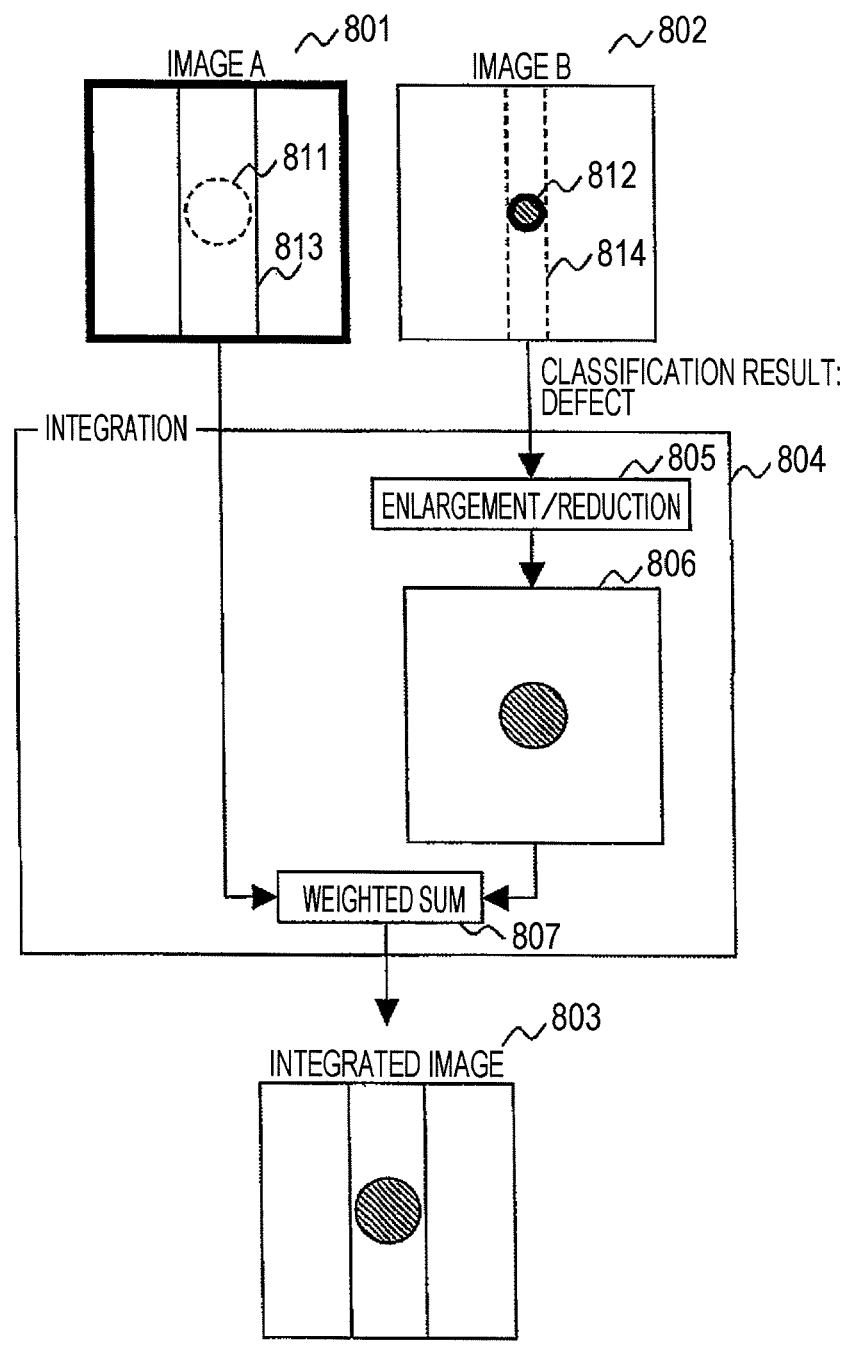
FIG. 8 is a diagram of an embodiment illustrating processing of two captured images having different magnifications.

FIG. 8 is a diagram of an embodiment illustrating processing of integrating two captured images having different magnifications. Consider a case to obtain an image 803 by integrating a defect 812 of an image 802 captured at a relatively low magnification to an image 801 captured at a relatively high magnification by processing 804. First, an ROI or a peripheral region is enlarged or reduced by enlargement/reduction processing 805, which will be necessary in later-stage integration. The magnification ratio can be calculated from the imaging magnification of the images 801 and 802. Alternatively, the magnification ratio may be calculated from a ratio of sizes of things appearing in the both images, for example, patterns 813 and 814, or defects 811 and 812. Following that, weighted addition of the image 801 and an enlarged/reduced image 806 is performed, so that an image 803 having the same magnification as the image 801 is generated.

In the present embodiment, the image 803 has been generated by adjusting the magnification to the image 801. However, an image having a different magnification from both of the images 801 and 802 may be generated. For example, to generate an image having a higher magnification than the image 801, the enlargement processing is performed with respect to the images 801 and 802 with corresponding magnification ratios, and then the weighted addition may just be performed.

Figure 9:
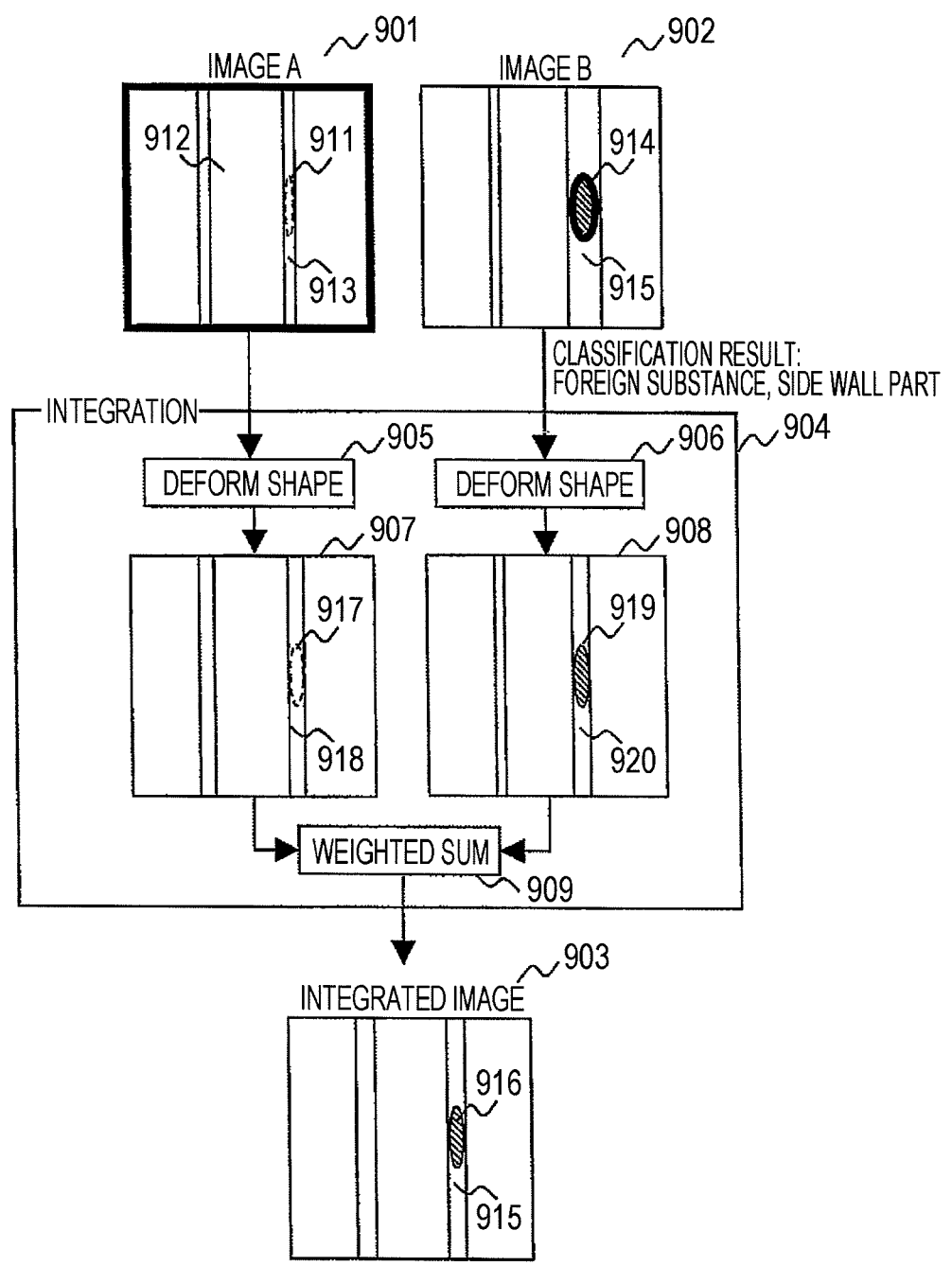
FIG. 9 is a diagram of an embodiment illustrating processing of performing integration while deforming the shapes of an ROI and its peripheral region.

FIG. 9 is a diagram of an embodiment illustrating processing of performing integration while deforming the shapes of an ROI and its peripheral region. An image 901 is an image captured without being tilted, and an image 902 is a tilted image. A defect 911 exists in a side wall part 913 of a pattern 912, and the defect is not easily viewed in the image 901. In the tilted image 902, a side wall part 915 corresponds to a large region on the image, and the visibility of a defect 914 is more favorable than that of the image 901. The two images are integrated by processing 904, and an image 903 in which a defect 916 can be clearly viewed is created. As a classification result of ROI, a foreign substance existing in the side wall part is obtained. The image 903 is created using the image 901 as the base image so that the image 903 can have a visually similar appearance to the image 901. In the integration processing 904, first, shape deformation is performed with respect to each of the images 901 and 902 by shape deformation processing 905 and 906, and then weighted sum processing 909 is performed. Since the side wall region is too narrow in the image 901, it is difficult to generate an image having a clear defect 914 by an integration method of adjusting the size of the side wall part of the image 902 to the image 901 and performing the weighted addition. Therefore, the shape deformation processing is also performed with respect to the image 901, so that the side wall region is enlarged. Images 907 and 908 are outputs of the shape deformation processing 905 and 906. In the image 907, the region of the side wall part 918 is enlarged with respect to the image 901, and the size of a defect 917 becomes large. However, the image 907 is created from the image 901 by image processing, and thus the image quality of the defect part is poor. Thus, the image quality of the defect is enhanced by the weighted addition with the image 908. In the shape deformation processing 906, the shape deformation is performed such that the positions and regions of a side wall part 920 and a defect 919 are adjusted to the image 907. Note that misregistration often occurs in the images 901 and 902. Therefore, misregistration correction may be performed with respect to at least one of the images as preprocessing.

When an image that is not tilted and a tilted image are integrated, a failure of a discontinuous joint or the like occurs in the integrated image if the shape is not appropriately deformed similarly to the diagram of an embodiment of FIG. 8. In contrast, by performing the shape deformation with respect to the ROI and its peripheral region like the present embodiment, the integration can be naturally performed.

The integration of an image that is not tilted and a tilted image has an advantage in terms of resolution. When a sample having a larger height than the depth of focus is captured, focused captured images cannot be obtained in all positions, and an image having a poor resolution is obtained in some positions. In a tilted image, the sample has a larger height as a tilt angle is larger because the sample is captured from a diagonal direction, and thus it becomes difficult to obtain a focused image having a high resolution in all positions. Therefore, an image in which the ROI has satisfactory visibility and other regions have a high resolution can be obtained by integrating the image such that a tilted image is used in the ROI and an image that is not tilted is used in other regions.

Figure 10:
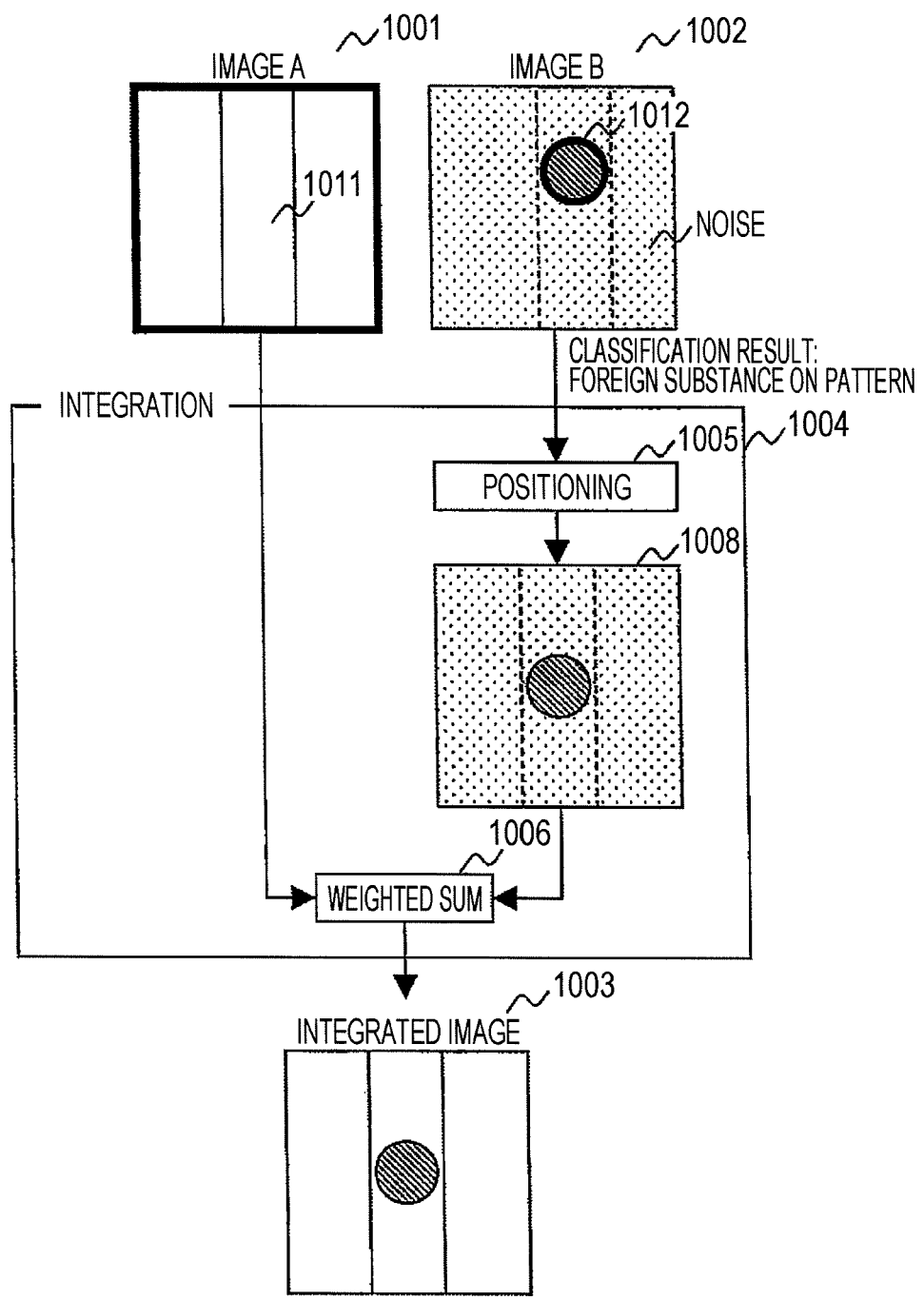
FIG. 10 is a diagram of an embodiment illustrating processing of integrating two images obtained by capturing different regions.

FIG. 10 is a diagram of an embodiment illustrating processing of integrating two images obtained by capturing different regions. An image 1002 is an image obtained by capturing a region including a defect. An image 1001 is an image including a pattern similar to the image 1002 and obtained by capturing a region different from the image 1002. As a classification result of ROI, a foreign substance on the pattern is obtained. The image 1001 is obtained by a capturing condition different from the image 1002; and a noise amount is relatively small. The image 1001 may be a captured image on another chip in a semiconductor wafer, or may be a captured image in the same chip. Further, the image 1001 may be an image obtained by capturing a plurality of patterns having similar shapes and taking a weighted average (golden image), and decreasing the noise amount. An image 1003 including an ROI and having a small noise amount is generated by integrating the images 1001 and 1002 by the processing 1004. Corresponding patterns appear in the images 1001 and 1002, but misregistration occurs because different regions are captured. Therefore, first, the position of the image 1002 is corrected to be adjusted to the image 1001 by positioning processing 1005. Following that, weighted sum processing 1006 is performed. In the weighted sum processing 1006, a large weight is set to the image 1008 after the positioning in the ROI. In other regions, appropriate weights are set to the images 1001 and 1002 according to the noise amounts included in the images, so that a satisfactory image in which the noise amount is further suppressed than the image 1001 can be generated. For example, the weights to the images 1001 and 1002 are set to be inversely proportional to the square of the standard deviation of the noises included in the respective images.

Note that, the noise amount of the image 1001 may be equal to, or more than the noise amount of the image 1002. In this case, an image having less noises can be obtained using both of the information of the images 1001 and 1002 in the regions other than the ROI.

Next, ROI extraction processing corresponding to step 102 of FIG. 1 will be described with reference to FIGS. 11 and 12.

Figure 11:
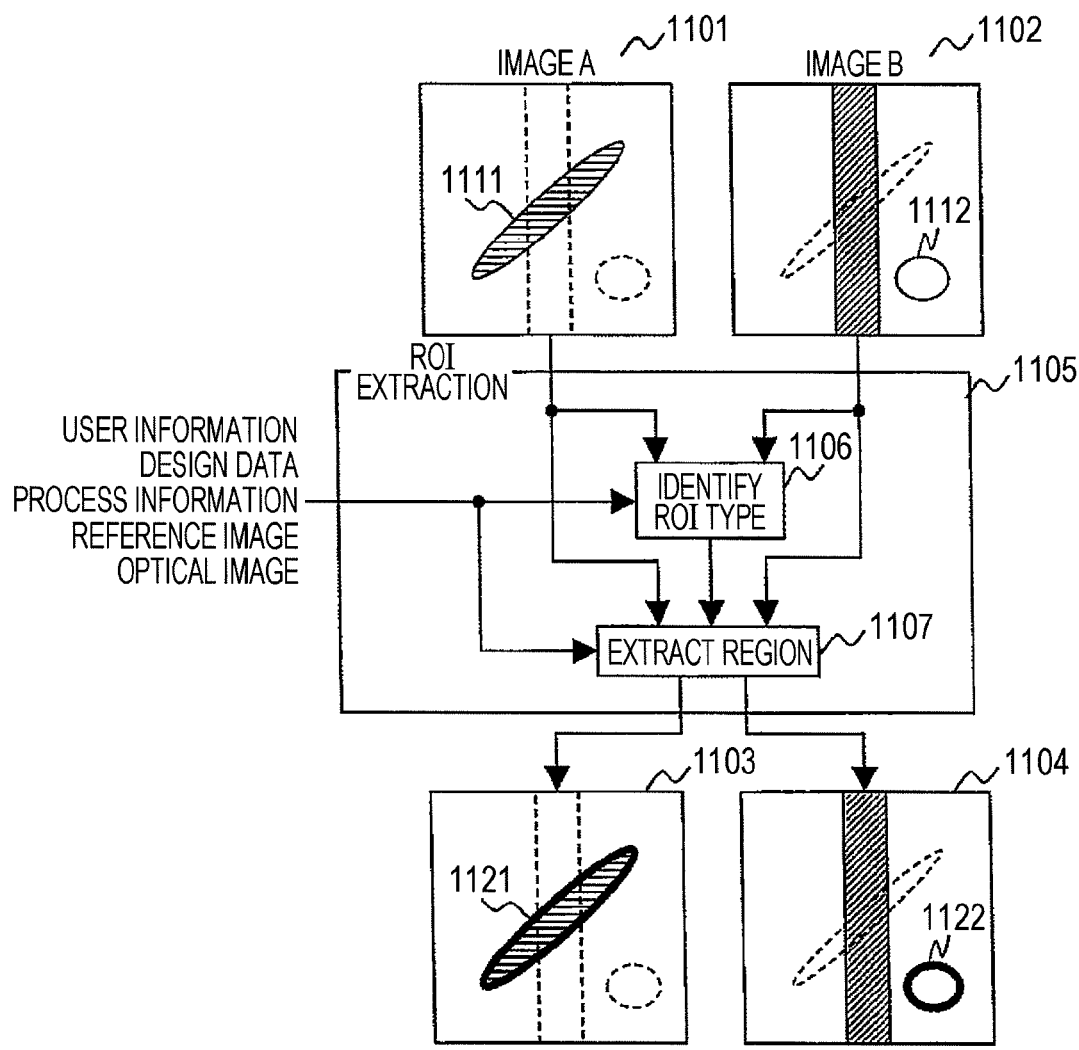
FIG. 11 is a diagram of an embodiment in which ROIs included in two captured images are extracted.

FIG. 11 is a diagram of an embodiment that extracts ROIs included in two captured images. A pattern, a long and narrow elliptic defect 1111, and a circular defect 1112 appear in captured images 1101 and 1102. However the defect 1111 more clearly appears in the image 1101 while the defect 1112 more clearly appears in the image 1102. ROI extraction processing 1105 is performed with respect to the two images. This processing is made of ROI type identification processing 1106 and region extraction processing 1107. In the ROI type identification processing 1106, the ROI is identified as a defect region and a lower layer region, for example. This ROI type identification processing may be performed based on information such as user information, design data, and process information. For example, when information that the user has an interest only in the lower layer region is input, the ROI may be identified to be the lower layer region only. Further, the ROI type identification processing may be performed based on an optical image, and the like. The type of the ROI may be identified based on the captured image. Next, the region extraction processing 1107 is performed. This processing can be performed by comparing an image (reference image) obtained by capturing another region in which a similar pattern appear and the captured image. When the ROI is the lower layer region, the region extraction can be performed by comparing the design data and the captured image, or by extracting a region having low brightness from the captured image. An example of the ROI extraction result is illustrated in images 1103 and 1104. Regarding defects 1121 and 1122 included in the images, the defects are respectively extracted from images in which the defects more clearly appear. Like this example, in a plurality of captured images to be integrated, a plurality of ROIs may exist, and a different region may be extracted for each captured image like the defect 1121 of the image 1103 and the defect 1122 of the image 1104.

Figure 12:
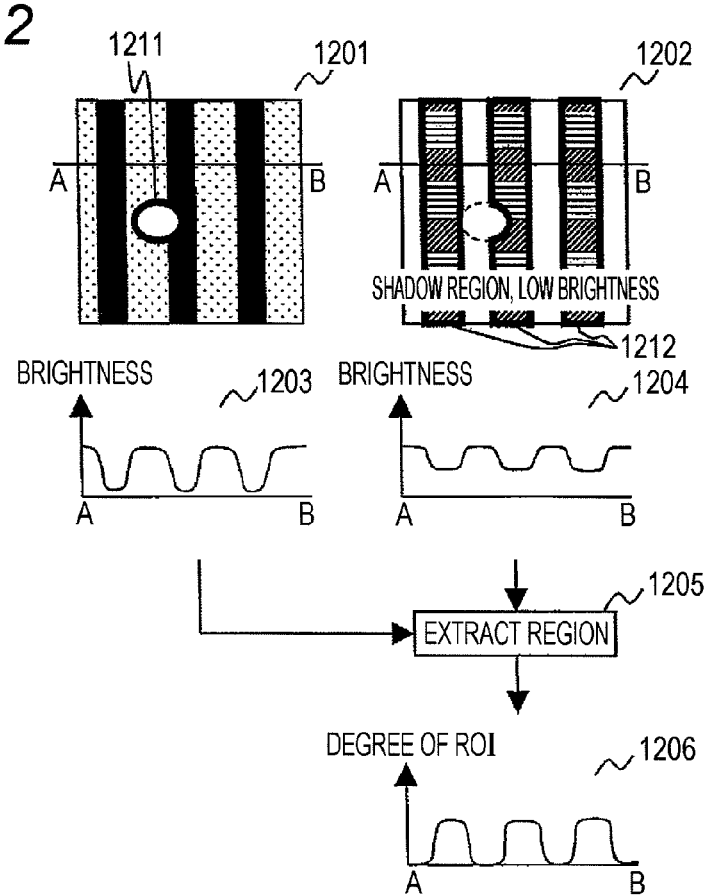
FIG. 12 is a diagram of an embodiment illustrating ROI extraction processing, which is different from FIG. 11.

FIG. 12 is a diagram of an embodiment illustrating the ROI extraction processing, which is different from FIG. 11. ROIs are extracted from two captured images 1201 and 1202. Assume that the ROIs to be extracted are a defect 1211 of the image 1201 and a lower layer region 1212 of the image 1202. In the present embodiment, only the line segments AB in the images will be described. Graphs 1203 and 1204 respectively illustrate the brightness values of the images 1201 and 1202 in the line segments AB. Region extraction processing 1205 is performed using the information. Comparing the graphs 1203 and 1204, the contrast between the upper layer region and the lower layer region is higher in the graph 1203 than the graph 1204, and thus the lower layer can be reliably extracted using the graph 1203. However, the width of the lower layer region is narrower in the image 1211 than the image 1202. Thus, after the lower layer is roughly extracted from the image 1201, fine extraction is performed using the image 1202. A graph 1206 illustrates the degree of ROI in the line segment AB. While, in FIG. 11, the ROI extraction result is an image having a binary value (that is, image data that only expresses whether the ROI or not for each pixel), in FIG. 12, the degree of ROI is a continuous value from 0 to 1. If the degree of ROI is the continuous value (or a discrete value having a small pitch width), weighted addition processing using continuous weights can be performed in later-stage integration processing, and processing that enables the ROI boundary to be more naturally viewed can be performed.

Figure 13:
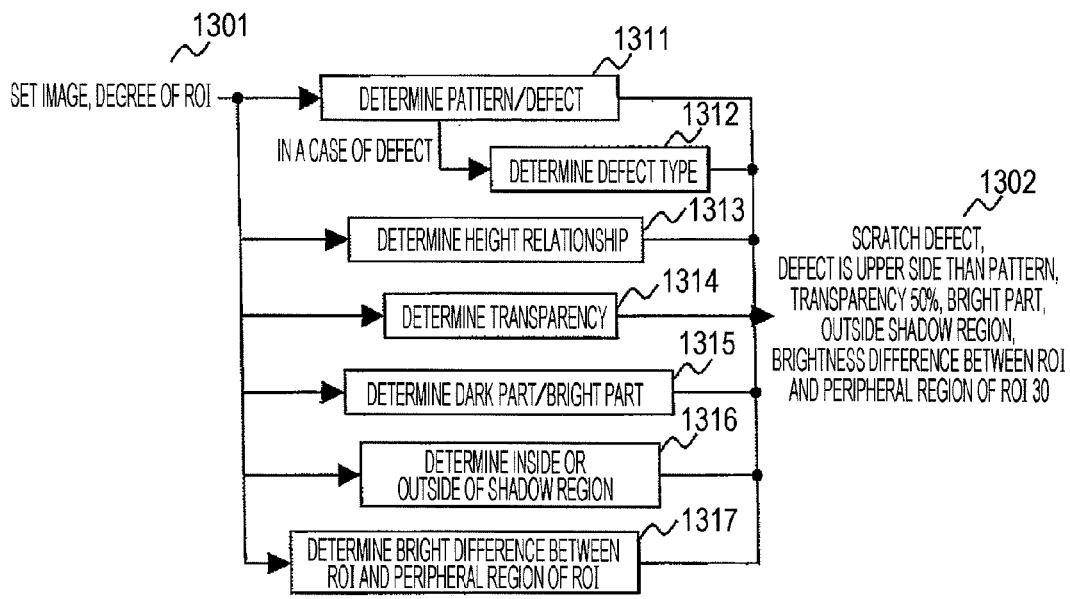
FIG. 13 is a diagram of an embodiment illustrating a flow of ROI classification processing corresponding to step 103 of FIG. 1.

FIG. 13 is a diagram of an embodiment illustrating a flow of the ROI classification processing corresponding to step 103 of FIG. 1. In this processing, a classification result 1302 is output using a set of captured images and the degree of ROI as an input 1301. In this example, a region where the degree of ROI is high is classified by performing processing 1311 to 1317. First, whether an object appearing in the ROI is a pattern or a defect is identified by the pattern/defect determination processing 1311. As a result, when it has been determined that the object is a defect, the defect type determination processing 1312 is performed. Determination of pattern/defect can be performed by calculating a difference between an image (reference image) obtained by capturing another region in which a similar pattern appears and a captured image, and determining, if the difference is large, the captured image is a defect, otherwise a pattern. Further, a technique of machine learning can be used. A method of determining a defect type is disclosed in JP-2000-99727-A, for example. Further, the height relationship between a plurality of objects existing in the ROI and its peripheral region is identified by height relationship determination processing 1313. One example of an identification method will be described with reference to FIG. 14. In the transparency determination 1314, the transparency of the object in the ROI is determined. For example, while the defect 311 illustrated in FIG. 3 has almost no transparency, and an object underlying the defect does not appear, the uneven defect 324 has a high transparency. The transparency can be determined by performing the processing 503 of estimating an image having no defect of FIG. 5, and performing comparison with the result. In dark part/bright part determination processing 1315, whether the object is a dark part such as the lower layer region, or a bright part such as the upper layer pattern is determined according to the brightness value. In shadow region inside/outside determination processing 1316, whether the ROI exists inside a region of a shadow of the upper layer pattern that exists in the vicinity of the ROI is determined. In the brightness difference determination processing 1317, a difference between representative brightness values of the ROI and its peripheral region is calculated. The representative value may be an average of the brightness values, or may be an amount obtained from the average of the brightness values and the standard deviation.

As described above, by classifying the ROIs based on a plurality of determination criteria, appropriate integration processing can be performed for each type of ROI.

Results of the processing 1311 to 1317 may be a discrete value or a continuous value. For example, the pattern/defect determination processing 1311 returns a binary value, but the transparency determination processing 1313 may return a continuous value that expresses the transparency. Further, the determination may be performed with respect to each pixel or each small region in the ROI. What kind of classification is performed can be changed according to an object. For example, if the object is not a sample including a defect, the pattern/defect determination processing 1311 is not necessary, and if the object is an image without a shadow, the shadow region inside/outside determination processing 1316 is not necessary. A classification item may be selected from the user through an interface, and the like described below, or may be automatically switched in each process.

Figure 14:
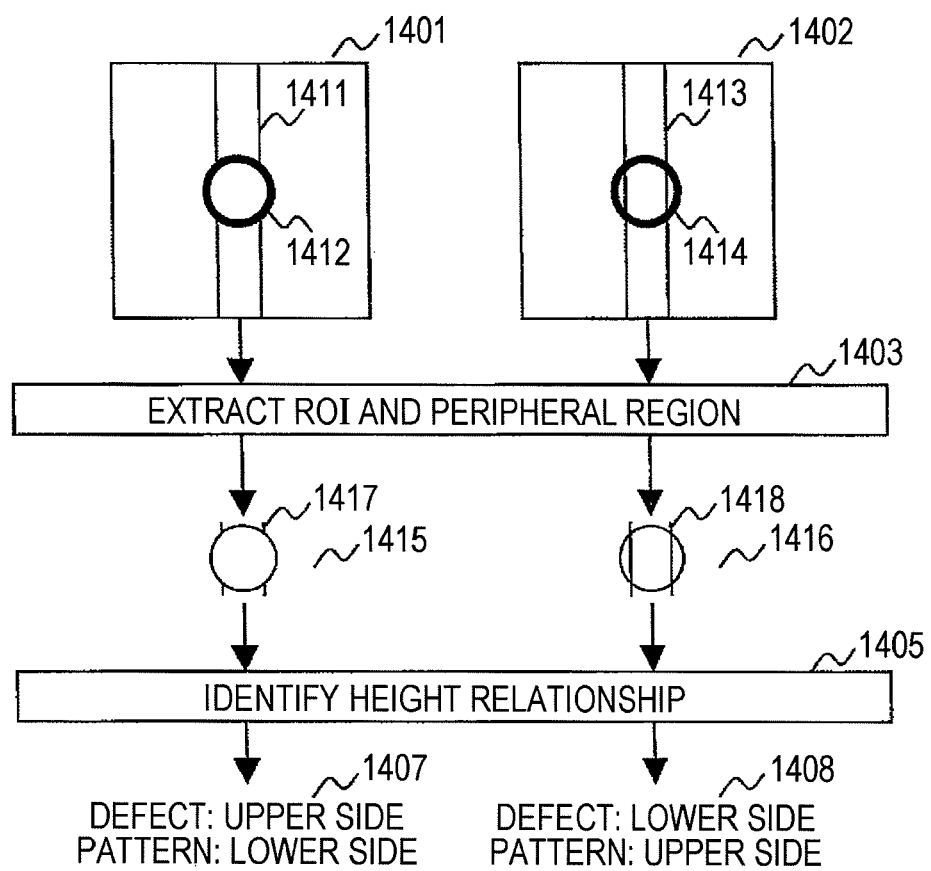
FIG. 14 is a diagram of an embodiment illustrating processing of identifying a height relationship among a plurality of objects existing in ROIs.

FIG. 14 is a diagram of an embodiment illustrating processing of identifying a height relationship among a plurality of objects existing in ROIs. Description will be given using an example of two images 1401 and 1402. In the both images, regions 1412 and 1414 in which defects appear are ROIs. Other than the defects, patterns 1411 and 1413 are included in the ROIs. The defects are foreign substances having almost no transparency. First, ROI and peripheral region extraction processing 1403 is performed. This processing can be realized by extracting a region in which the degree of ROI is high, and a region in the vicinity of the region. Accordingly, regions 1415 and 1416 can be respectively extracted from the both images. Next, processing 1405 of identifying the height relationship is performed. The region 1415, a pattern 1417 cannot be viewed inside a defect region, and thus, it is found that the defect exists at an upper side. Meanwhile, in the region 1416, a pattern 1418 can be viewed inside a defect region in a connected manner, and thus it is found that the defect exists at a lower side. In this way, determination can be performed based on information of whether the pattern can be viewed in a connected manner.

By performing the classification of the ROIs using such identification, integration in which information related to the heights of the objects is stored can be performed. Therefore, a natural image can be provided. For example, the processing can be performed such that the defect can be viewed to exist at an upper side of the pattern even in the integrated image regarding the image 1401, and the defect can be viewed to exist at a lower side of the pattern even in the integrated image regarding the image 1402.

For the identification of the height relationship, a method different from the example of FIG. 14 may be used. For example, when a shadow image can be used, the height relationship can be obtained using how a shadow is formed. Alternatively, the height relationship can be obtained using the design data.

Figure 15:
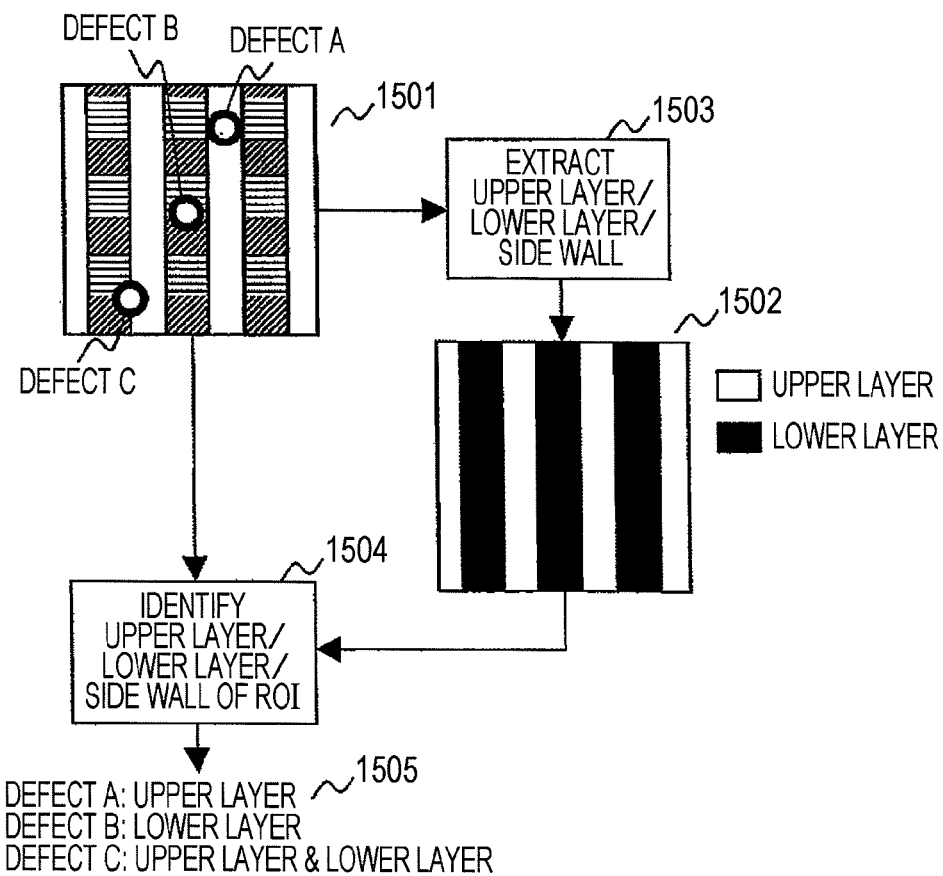

FIG. 15 is a diagram of an embodiment illustrating processing of identifying which one of an upper layer pattern region (hereinafter, an upper layer region), a lower layer region, and a pattern side wall region (hereinafter, a side wall region) an ROI belongs to. An image 1501 is an image to be identified. Three defects A to C included in the image are the ROIs. First, the image is divided into the upper layer region, the lower layer region, and the side wall region by upper layer/lower layer/side wall extraction processing 1503. This processing can be performed using how a shadow is formed or the design data. Alternatively, a region having a relatively high brightness value can be identified as the upper layer region, and a region having a relatively low brightness value can be identified as the lower layer region. There is no side wall region in the example of the image 1501, and is divided into the upper layer region and the lower layer region like the image 1502. Next, which region the ROI belongs to is identified by upper layer/lower layer/side wall identification processing 1504. To perform the processing, which region the ROI belongs to may just be obtained using the image 1502. The defect A belongs to the upper layer region, and the defect B belongs to the lower layer region in the example of the image 1501. The defect C belongs to both of the upper layer region and the lower layer region.

When the ROI exists in the lower layer region or the side wall region, more advanced processing than the weighted addition processing is often required in order to improve the visibility. For example, when the ROI exists in the lower layer region, charged particles discharged from a sample is shielded by the upper layer pattern, and thus it is difficult for the particles to reach the detector, and the contrast is often decreased. To make the ROI apparent in such an image, the brightness adjustment is necessary in addition to the weighted addition. Further, when the ROI exists in the side wall region, the side wall region is a small region in the image, and thus the visibility is not often satisfactory. When the ROI exists in the side wall region, the image may be irradiated with the charged particle beam from a diagonal direction instead of immediately above (that is, in a tilted manner) and captured. At this time, by integrating a tilted image with an image captured without being tilted, the visibility of the ROI can be improved. However, before the integration, it is necessary to appropriately enlarge/reduce the image so that correspondence between pixels of respective images is generated. By identifying which one of the upper layer region, the lower layer region, and the side wall region the ROI belongs to, like the embodiment of FIG. 15, an appropriate integration method can be selected according to a result.

Figure 16:
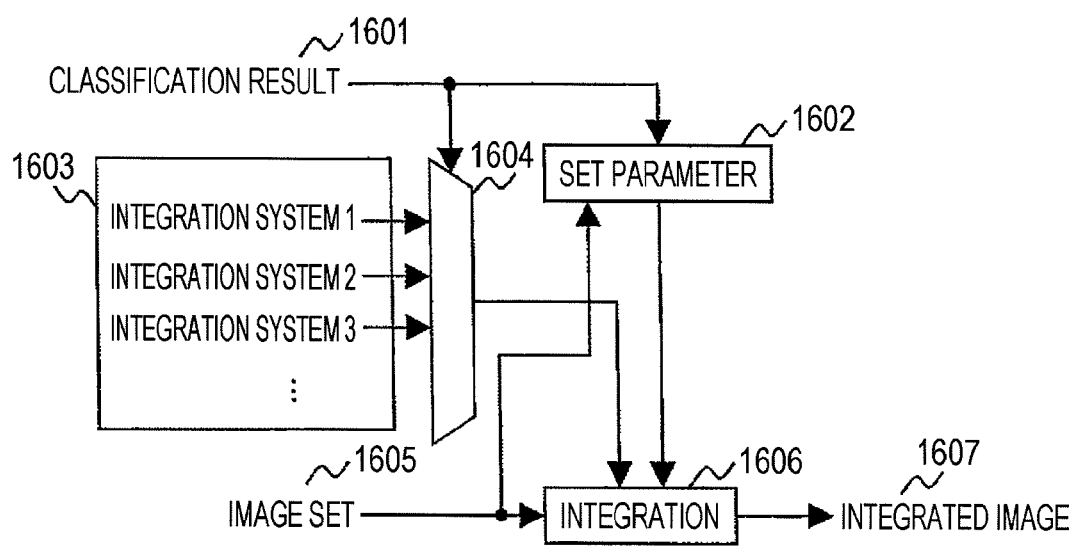
FIG. 16 is a diagram of an embodiment illustrating processing of controlling an integration method according to a classification result.

FIG. 16 is a diagram of an embodiment illustrating processing of controlling the integration method according to a classification result. In this processing, an integrated image 1607 is obtained using a set of a classification result 1601 and a captured image 1605 as an input. A relationship between classification results and integration method to be applied is held as data such as a table 1603, or the like, in advance. First, which integration method will be used is determined by switch processing 1604 according to the given classification result 1601. Further, a parameter necessary for the integration processing is determined by parameter setting processing 1602 according to the classification result. In the parameter setting processing 1602, a relationship between the classification results and parameters to be applied is held as data such as a table, or the like, in advance, and a corresponding value is read according to the classification result. In the parameter setting processing 1602, the processing may be performed using a captured image. For example, when it is desired to perform the brightness value adjustment processing, a more appropriate value can be often set by performing adjustment so as to uniform average brightness values of certain regions if a captured image to be integrated is used. Finally, integration of an image set 1605 is performed by integration processing 1606.

The classification result may include a continuous value. In this case, the switch processing 1604 and the parameter setting processing 1602 may include processing of calculating which system and parameter from among the data such as the table will be used. Note that one or more ROIs do not always necessarily exist, and there is a case where no ROI exists depending on a captured image. In such as case, appropriate processing can be performed by returning a classification result indicating there is no ROI, and using an appropriate integration method suitable for the case.

Figure 17:
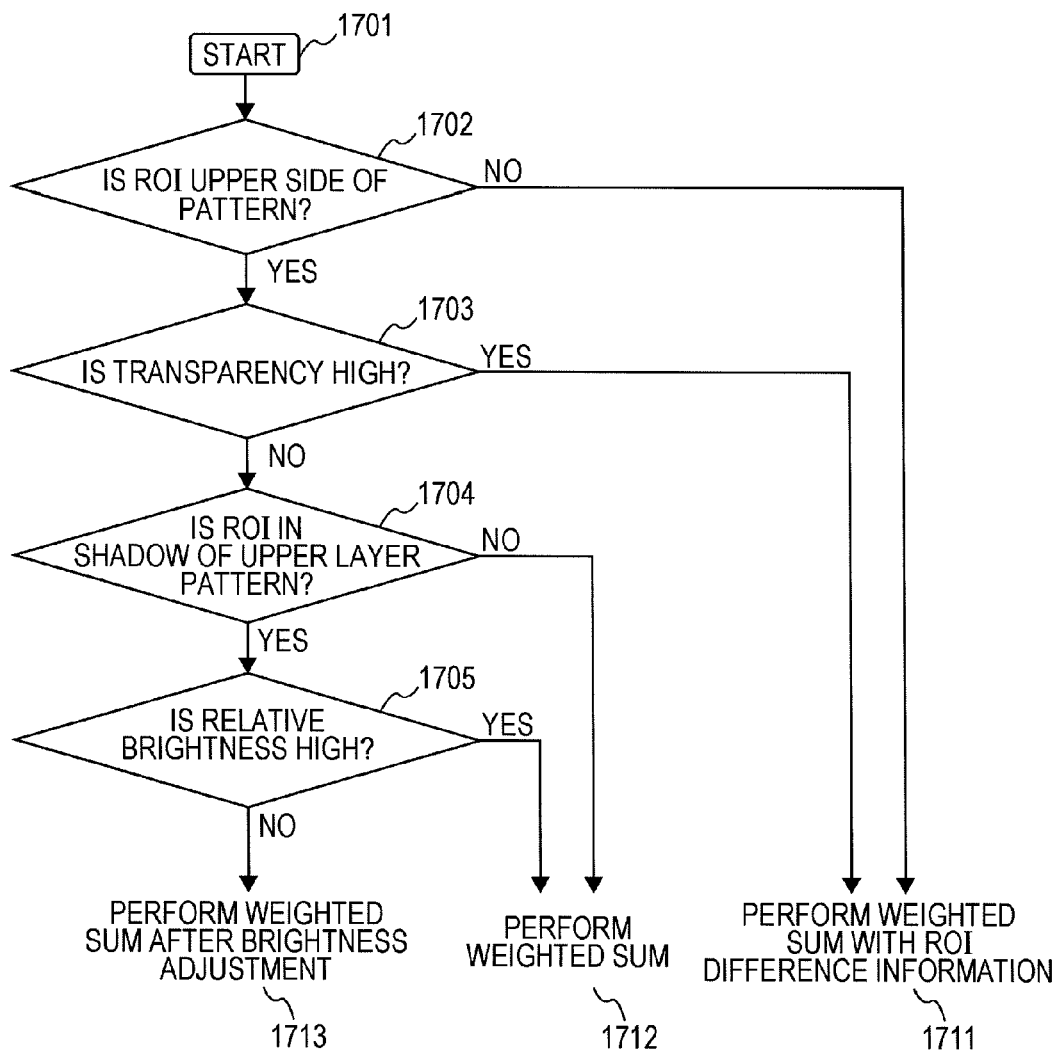
FIG. 17 is a diagram of an embodiment illustrating processing of controlling an integration method according to a classification result.

FIG. 17 is a diagram of an embodiment illustrating processing of controlling the integration method according to a classification result. While, in FIG. 16, processing of controlling the integration method for each classification result using data such as a table has been described, the present embodiment controls the integration method for each classification result based on a predetermined rule. In this example, the ROI is a defect, and whether the ROI exists at an upper side of a pattern, whether the transparency is high, whether the ROI is a shadow of the upper layer pattern, and whether the relative brightness is high are determined by processing 1702 to 1705, and the integration method is changed according to a result thereof. First, whether the ROI exists at an upper side of a pattern is determined by the determination processing 1702, and if it has been determined that the ROI does not exist at an upper side of a pattern, the weighted sum processing 1711 with the ROI difference information as described in the diagram of the embodiment of FIG. 5 is performed. Next, when it has been determined that the ROI exists at an upper side of the pattern, whether the transparency is high is determined by the determination processing 1703. This processing may just be determined according to whether the transparency exceeds a threshold value, for example. When it has been determined that the transparency is high, the processing 1711 is performed. Meanwhile, when it has been determined that the transparency is not high, whether the ROI exists in a region of a shadow of the upper layer pattern is determined by the determination processing 1703. When it has been determined that the ROI does not exist in the region of a shadow, the weighted sum processing 1712 as described in the diagram of the embodiment of FIG. 4 is performed. When it has been determined that the ROI exists in the region of a shadow, whether the relative brightness of the ROI with respect to its peripheral region is high is determined by the determination processing 1705. When it has been determined that the relative brightness is high, the weighted sum processing 1712 is performed. Meanwhile, when it has been determined that the relative brightness is low, the processing 1713 of calculating the weighted sum after the brightness adjustment as described in the diagram of the embodiment of FIG. 6 is performed.

Figure 18:
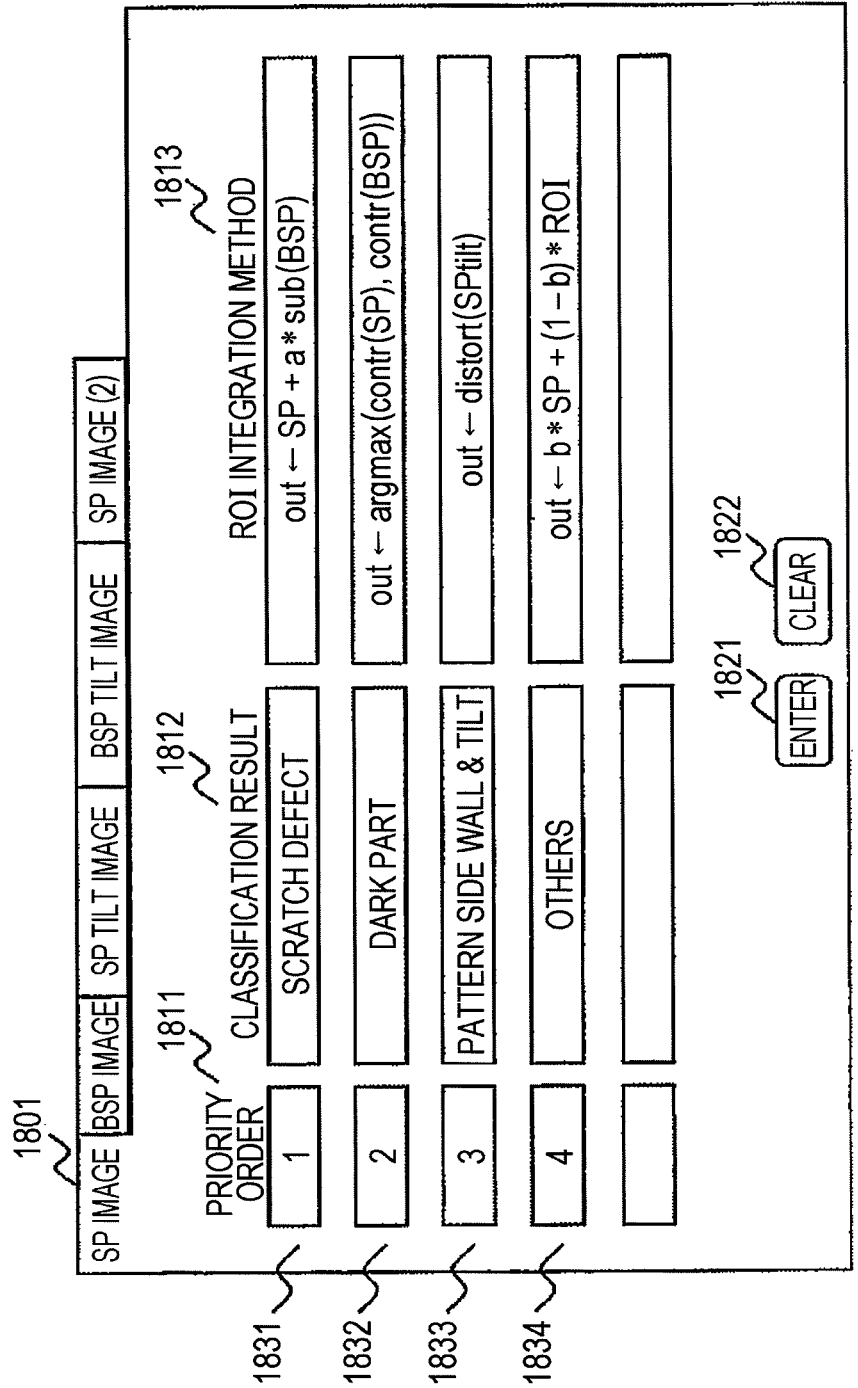
FIG. 18 is a diagram of an embodiment illustrating a user interface for setting an integration method for each classification result.

FIG. 18 is a diagram of an embodiment illustrating a user interface for setting the integration method for each classification result. With a tab 1801, setting related to the method of generating an integrated image using each image as the base image can be switched. This example illustrates a screen to set the integration method for creating an integrated image using the SP image as the base image from among four captured images: a secondary charged particle image (SP image) captured without being tilted, a backscattering particle image (BSP image), an SP image obtained by being tilted and captured, and a BSP image. If the tab 1801 is set to the BSP image, the integration method of generating an integrated image using the BSP image as the base image can be identified from among the same four captured image. Any number of integrated images can be generated from the four captured images. Two integrated images using the SP image as the base image may be generated. The screen to set the integration method is made of a cell 1812 to set a classification result of an object, a cell 1813 to identify a corresponding integration method, and a cell 1811 to identify the priority of the setting. In addition, there are an enter button 1821 to determine the setting, and a clear button 1822 to return the setting to a default value.

The row of 1831 indicates that, when the classification result is the scratch defect, a value obtained by adding a times a difference of the ROI in the BSP image to the SP image (the description "sub (·)" in the cell expresses a function to obtain the difference of the ROI) is an integration result of the ROI. This processing corresponds to the integration method described in the drawing of the embodiment of FIG. 5. "a" is a parameter, and a value separately identified by the user may be used, or "a" may be automatically determined based on an evaluation index such as the contrast in the ROI being a fixed value or more. The integration method in the regions other than the ROI is not described in the diagram of the embodiment, but the integration method may be set through an interface, or may be automatically controlled, in a similar manner. For example, in the case of the row of 1831, in the regions other than the ROI, the SP image that is the base image may just be used as it is. When the shape deformation or the brightness adjustment is necessary, corresponding processing may just be performed. The case of the row of 1832 indicates that, when the classification result of the dark part, an image having a higher average brightness value (the description "argmax (·)" in the cell expresses a function to select an image having a higher average brightness value) from between an image obtained by applying the brightness adjustment to the SP image (the description "contr (·) in the cell expresses a function to perform brightness adjustment) and an image obtained by applying the brightness adjustment to the BSP image is an integration result of the RI. Between the rows of 1831 and 1832, the row 1831 has a higher priority. Thus, when there is a scratch defect in a dark part, the integration method identified in the row 1831 is applied. The row of 1833 indicates that, when a classification result is an ROI that exists in a pattern side wall region, and is extracted from a tilted image, an image obtained by applying the shape deformation to a tilted SP image (the description "distort (·)" in the cell expresses a function to apply the shape deformation) is an integration result of the ROI. At this time, as described in the diagram of the embodiment of FIG. 9, when the base image is also subjected to the shape deformation, the ROI may be more easily viewed. Thus, the base image is also automatically subjected to the shape deformation as needed. The row of 1834 indicates that, when the classification result is all others, a sum of an image that is b times the SP image and an image that is (1−b) times the ROI is an integrated image of the ROI. "b" is a parameter. In this way, by providing an interface to identify the integration method for each classification result, the integration method can be controlled by a method desired by the user.

The integration method may include a function to specify details as needed. Meanwhile, even when detailed specification has not been performed, the processing may be automatically performed to some extent. For example, the parameter a in the row 1831 can be subjected to processing of automatically setting an appropriate value without performing specification as described above. Similarly, the brightness adjustment in the row 1832 and the shape deformation in the row 1833 can be subjected to the processing of automatically setting the values.

Further, the interface screen may include an interface to add/delete/modify the tags, an interface to increase/decrease the number of rows of the cells, and an interface to write the setting to a file and to read the setting from a file. Further, the interface screen may include an interface to perform detailed setting such as a parameter.

Figure 19:
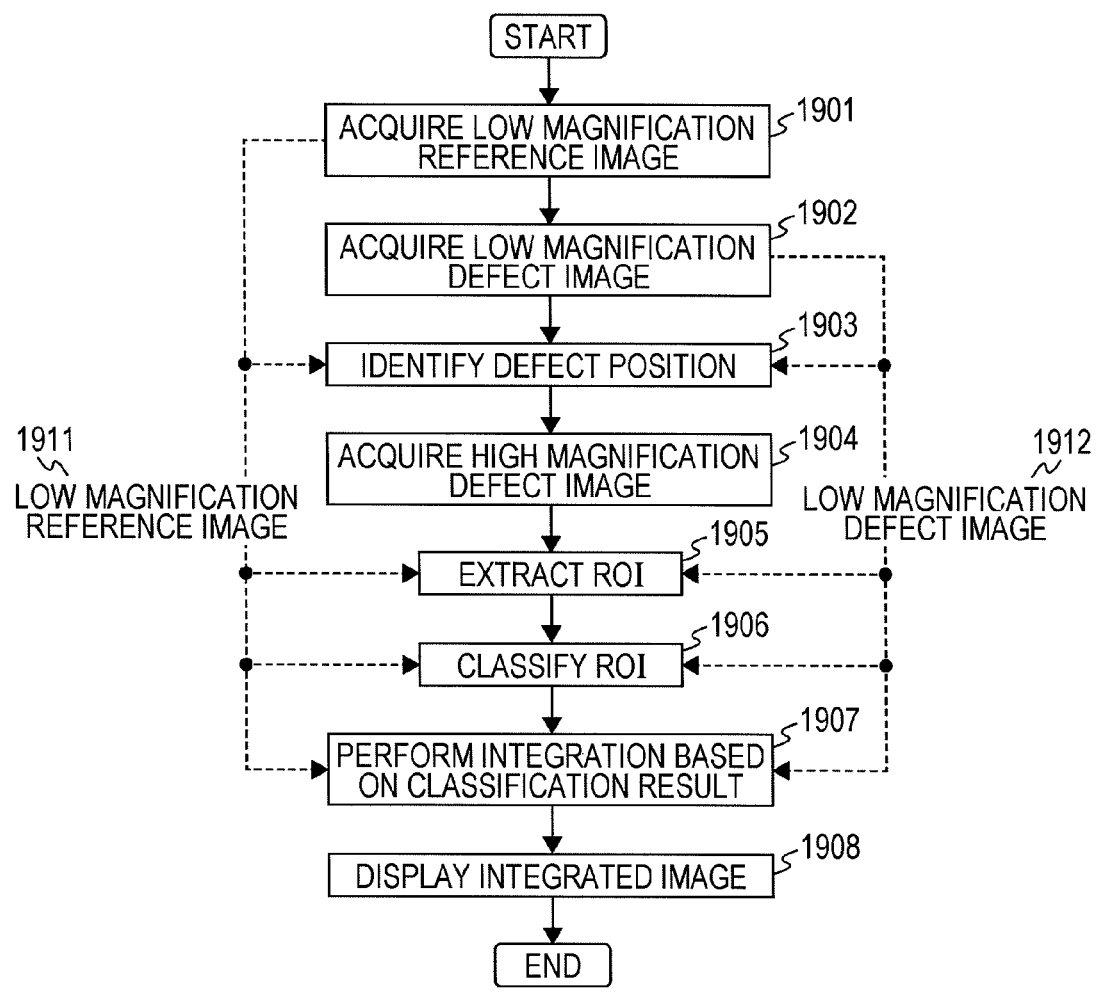
FIG. 19 is a diagram of an embodiment illustrating a sequence to automatically capture a high magnification defect image and to obtain an integrated image thereof.

FIG. 19 is a diagram of an embodiment of a sequence to automatically capture a high magnification image including a defect and to obtain an integrated image thereof. To automatically capture a high magnification image including a defect, it is necessary to obtain the position of the defect with high accuracy. Thus, preprocessing of capturing a low magnification image first, and obtaining the position of the defect from the low magnification image with high accuracy by performing defect detection processing is sometimes necessary. Therefore, first, in step 1901, a low magnification reference image 1911 is acquired. The reference image may be an image obtained by capturing a corresponding position in another chip of a semiconductor wafer, or may be an image obtained by capturing a position where a pattern having a similar shape exists in the same chip. Next, in step 1902, a low magnification defect image 1912 is acquired, and in step 1903, the position of the defect is identified using the low magnification reference image 1911 and the low magnification defect image 1912. Following that, in step 1904, a high magnification defect image is acquired. In step 1905, an ROI is extracted, and in step 1906, the ROI is classified. In step 1907, images are integrated based on the classification result, and finally, in step 1908, the integrated image is displayed. The method of acquiring a high magnification defect image is disclosed in JP-9-139406-A, for example. The integration image may be stored in a database or the like before being displayed, and may be collectively displayed in the end after the processing of steps 1901 to 1907 is repeated for each position of a defect to be observed.

When an ROI is extracted in step 1905, or the ROI is classified in step 1906, not only the high magnification image, but also the low magnification reference image 1911 and the low magnification defect image 1912 may be used. Further, when images are integrated in step 1907, a plurality of high magnification defect images may be integrated, any of or both of the low magnification reference image 1911 and the low magnification defect image 1912, and the high magnification defect image may be integrated, or only any of or both of the low magnification reference image 1911 and the low magnification defect image 1912 may be used to perform integration. Alternatively, another image (a low magnification reference image, a low magnification defect image, or a high magnification defect image) obtained when the position of another defect is captured may be used to perform integration.

As described in the embodiments, the problems are solved by the method of displaying an image and the charged particle microscope in which the method of displaying an image is incorporated.

(1) The present invention captures a plurality of images, extracts ROIs from the captured images and classifies the ROIs, then integrates the plurality of captured images, and displays the integrated image. At this time, the present invention controls the integration method according to classification results of the ROIs.

Accordingly, even if the appearance of the ROI in the image is different for each ROI, the method suitable for each ROI can be selected and the integration can be performed. Thus, an image in which the image quality of the ROI is favorable can be provided.

(2) Further, the present invention identifies the height relationship among a plurality of objects existing in the ROI in the classification of the ROI.

Here, it has been expressed that, when closer to the charged particle source, an object exists at a higher position, and when farther, the object exists at a lower position. For example, the ROI includes a hole pattern, the bottom of the hole is at a relatively low position, and a region around the hole is at a relatively high position. The present invention can provide a natural image while remaining information related to the heights of the objects by performing the integration after identifying the height relationship of the objects. As a specific example, consider a case in which the ROI is a defect such as dust (hereinafter, a foreign substance) in an image obtained by capturing an oxide film. When the foreign substance exists on the oxide film, a pattern existing immediately under the foreign substance is usually not viewed in a region where the foreign substance appears. Meanwhile, when the foreign substance underlies the oxide film, the oxide film is viewed to rise up due to the foreign substance in the ROI. To make a natural image, it is necessary to integrate the images while remaining such a characteristic, and this can be possible by classifying the ROI using the height relationship.

(3) Further, the present invention identifies which at least two of the upper layer pattern region, the lower layer region, and the pattern side wall region, the ROI is, in the classification of the ROI.

When the ROI exists in the lower layer region or the pattern side wall region, more advanced processing than the weighted addition processing is often necessary in order to improve the visibility. For example, when the RI exists in the lower layer region, the charged particles discharged from the sample is shielded by the upper layer pattern, and thus it becomes difficult for the particles to reach the detector, and typically, the contrast is reduced. To make the ROI apparent in such image, not only the weighted addition but also the brightness adjustment is necessary. Further, when the ROI exists in the pattern side wall region, the pattern side wall region often corresponds to a small region in the image, and thus the visibility is not often favorable. When the ROI exists in the pattern side wall region, the sample may be irradiated with the charged particle beam from the diagonal direction instead of immediately above (that is, in a tilted manner), and the image is captured. At this time, the visibility of the ROI can be improved by integrating the tilted image to the image captured without being tilted. However, it is necessary to appropriately enlarge/reduce the image before the integration in order to perform association among the pixels of the images. As described above, an appropriate integration method differs according to which of the upper layer pattern region, the lower layer region, and the pattern side wall region the ROI exits. However, according to the present invention, the appropriate integration method can be applied by classifying which region the ROI exits, and controlling the integration method.

(4) Further, the present invention integrates the ROI and the peripheral region of the ROI to the captured image based on the shape information among the plurality of captured images in the peripheral region of the ROI.

Among the plurality of captured images, things appearing for each pixel may differ due to the image distortion. One typical example is an image that is not tilted and a tilted image. Further, there is a case in which, among the images captured by different types of detectors, while the information of the upper layer pattern is dominant in one image, the information of the lower layer region is dominant in another image in a boundary part of a pattern. In this case, the width of the lower layer region is viewed differently depending on the image. In these cases, if the shapes are appropriately deformed in advance, a failure of a discontinuous boundary, and the like occurs when the plurality of captured images is integrated.

(5) Further, the present invention stores the brightness/darkness relationship between the ROI and the peripheral region of the ROI and performs the integration.

The brightness values of the regions of the images may significantly differ among the plurality of captured images. For example, different types of detectors are used, the type and the characteristic of the particles detected in the detectors are different, and thus, typically, the brightness values are significantly different. Further, the number of particles that reaches the detectors is changed, and thus the brightness values differ. Therefore, the brightness and darkness are inverted and the image may sometimes be unnaturally viewed if simple weighted addition is performed. In contrast, the present invention stores the brightness/darkness relationship of the ROI and the peripheral region of the ROI by performing the brightness adjustment at the integration processing. Accordingly, the present invention suppresses the inverse of the brightness and darkness and enables natural integration.

According to the present invention of the patent application as described in (1) to (5) above, an effect to provide a scanning charged particle microscope and a method of displaying an image of the same that provides an image in which ROIs can be easily viewed is exerted by capturing a plurality of images, and controlling an integration method according to a classification result when integrating and displaying the plurality of captured imaged after extracting and classifying the ROIS from the captured images.

What is claimed is:

1. An observation method comprising:
    acquiring a plurality of captured images of a same position on a sample;
    extracting one or more regions to be observed from among the plurality of captured images acquired in the acquiring a plurality of captured images;
    classifying the one or more regions to be observed extracted in the extracting one or more regions to be observed; and
    integrating the plurality of captured images and generating an integrated image by selecting an integration method from a plurality of predetermined integration methods based on a classification result of the classifying the one or more regions to be observed, wherein said selecting an integration method further comprises selecting one of a weighted sum processing with difference information integration method, a weighted sum processing without difference information integration method, and a weighted sum after brightness adjustment integration method to be performed, based on at least whether or not the one or more regions are present at an upper side of a pattern and a relative brightness of said pattern.

2. The observation method according to claim 1, wherein the classifying the one or more regions to be observed classifies the one or more regions to be observed based on information related to heights of a plurality of objects existing in the regions to be observed, and
    the integrating the plurality of captured images determines the integration method based on the information related to the heights of the objects.

3. The observation method according to claim 1, wherein the classifying the regions to be observed classifies which at least two of an upper layer pattern region, a lower layer region, and a pattern side wall region the regions to be observed belong to.

4. The observation method according to claim 1, wherein the integrating the plurality of captured images integrates the regions to be observed and peripheral regions of the regions to be observed to at least one of the plurality of captured images after deforming the regions to be observed and the peripheral regions of the regions to be observed based on shape information among the plurality of captured images in the peripheral regions of the regions to be observed.

5. The observation method according to claim 1, wherein the integrating the plurality of captured images storing a brightness/darkness relationship between the regions to be observed and peripheral regions of the regions to be observed and performing the integration.

6. The observation method according to claim 1, further comprising:
    displaying the integrated image generated by the integrating the plurality of captured images.

7. An observation device comprising:
    an image acquisition unit configured to capture a sample and to acquire a plurality of captured images of a same position on said sample;
    a region to be observed extraction unit configured to extract one or more regions to be observed from the plurality of captured images acquired in the image acquisition unit;
    a region to be observed classification unit configured to classify the one or more regions to be observed extracted in the region to be observed extraction unit; and
    an image integration unit configured to integrate the plurality of captured images to generate an integrated image by selecting an integration method from a plurality of predetermined integration methods based on a classification result of the region to be observed classification unit,
        wherein said selecting an integration method further comprises selecting one of a weighted sum processing with difference information integration method, a weighted sum processing without difference information integration method, and a weighted sum after brightness adjustment integration method to be performed, based on at least whether or not the one or more regions are present at an upper side of a pattern and a relative brightness of said pattern.

8. The observation device according to claim 7, wherein the region to be observed classification unit classifies the one or more regions to be observed based on information related to heights of a plurality of objects existing in the regions to be observed, and
    the image integration unit determines the integration method based on the information related to heights of the objects.

9. The observation device according to claim 7, wherein the region to be observed classification unit classifies which at least two of an upper layer pattern region, a lower layer region, and a pattern side wall region the regions to be observed belong to.

10. The observation device according to claim 7, wherein the image integration unit integrates the regions to be observed and peripheral regions of the regions to be observed to at least one of the plurality of captured images after deforming the regions to be observed and the peripheral regions of the regions to be observed based on shape information among the plurality of captured images in the peripheral regions of the regions to be observed.

11. The observation unit according to claim 1, wherein the image integration unit stores a brightness/darkness relationship between the regions to be observed and peripheral regions of the regions to be observed, and performs integration.

12. The observation device according to claim 7, further comprising:
a display unit configured to display the integrated image generated. by the image integration unit.

13. The observation method according to claim 1, wherein said selecting an integration method further comprises:
selecting a weighted sum processing with difference information integration method to be performed, if the one or more regions are present at an upper side of a pattern and transparency is high, or if the one or more regions is not present at the upper side of a pattern;
selecting a weighted sum processing without difference information integration method to be performed, if the one or more regions is present at the upper side of a pattern, transparency is not high, the one or more regions is not present in a region of a shadow of the upper layer pattern, and a relative brightness is high, or if the one or more regions is present at the upper side of a pattern, transparency is not high, and the one or more regions is not present in a region of a shadow of the upper layer pattern; and
selecting a weighted sum after brightness adjustment integration method to be performed, if the one or more regions is present at the upper side of a pattern, transparency is not high, the one or more regions is present in the region of a shadow of the upper layer pattern, and the relative brightness is high.

14. The observation device according to claim 7, wherein said selecting an integration method further comprises:
selecting a weighted sum processing with difference information integration method to be performed, if the one or more regions are present at an upper side of a pattern and transparency is high, or if the one or more regions is not present at the upper side of a pattern;
selecting a weighted sum processing without difference information integration method to be performed, if the one or more regions is present at the upper side of a pattern, transparency is not high, the one or more regions is not present in a region of a shadow of the upper layer pattern, and a relative brightness is high, or if the one or more regions is present at the upper side of a pattern, transparency is not high, and the one or more regions is not present in a region of a shadow of the upper layer pattern; and
selecting a weighted sum after brightness adjustment integration method to be performed, if the one or more regions is present at the upper side of a pattern, transparency is not high, the one or more regions is present in the region of a shadow of the upper layer pattern, and the relative brightness is high.

* * * * *